United States Patent
Kawai

(10) Patent No.: US 9,712,748 B2
(45) Date of Patent: Jul. 18, 2017

(54) DRIVER AND IMAGE INSTRUMENT

(71) Applicant: Olympus Corporation, Shibuya-ku, Tokyo (JP)

(72) Inventor: Sumio Kawai, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 15/079,220

(22) Filed: Mar. 24, 2016

(65) Prior Publication Data

US 2016/0205325 A1    Jul. 14, 2016

Related U.S. Application Data

(63) Continuation of application No. PCT/JP2015/059159, filed on Mar. 25, 2015.

(30) Foreign Application Priority Data

Apr. 8, 2014   (JP) .................................. 2014-079660

(51) Int. Cl.
*H04N 5/232*   (2006.01)
*G02B 7/09*    (2006.01)
(Continued)

(52) U.S. Cl.
CPC .......... *H04N 5/23287* (2013.01); *G02B 7/02* (2013.01); *G02B 7/04* (2013.01); *G02B 7/09* (2013.01);
(Continued)

(58) Field of Classification Search
None
See application file for complete search history.

(56) References Cited

U.S. PATENT DOCUMENTS

2004/0012683 A1*  1/2004  Yamasaki .......... H04N 5/23248
                                                              348/208.1
2005/0146633 A1    7/2005  Kuo et al.
(Continued)

FOREIGN PATENT DOCUMENTS

JP   2000-194026   7/2000
JP   2004-120583   4/2004
(Continued)

OTHER PUBLICATIONS

First Japanese Office Action to corresponding Japanese Patent Application No. 2015-548078, mailed on Aug. 2, 2016 (2 pgs.) with translation (2 pgs.).
(Continued)

*Primary Examiner* — WB Perkey
(74) *Attorney, Agent, or Firm* — John C. Pokotylo; Straub & Pokotylo

(57) ABSTRACT

A driver includes a piezoelectric sheet, a fixing frame, a moving frame, and a control circuit. The piezoelectric sheet includes a first piezoelectric body portion which bends in a first direction, a second piezoelectric body portion which bends in a second direction that intersects at right angles with the first direction, and a connection portion which connects the first and second piezoelectric body portions. The fixing frame is fixed to the connection portion. The moving frame is supported on the first and second piezoelectric body portions. The control circuit applies voltage signals to the first and second piezoelectric body portions to bend the first and second piezoelectric body portions and which moves the moving frame in one of the first direction and the second direction or in a composite direction of the first direction and the second direction.

12 Claims, 19 Drawing Sheets

(51) Int. Cl.
*G02B 27/64* (2006.01)
*H01L 41/04* (2006.01)
*H01L 41/053* (2006.01)
*H01L 41/083* (2006.01)
*H01L 41/09* (2006.01)
*G02B 7/02* (2006.01)
*G02B 7/04* (2006.01)

(52) U.S. Cl.
CPC .......... *G02B 27/646* (2013.01); *H01L 41/042* (2013.01); *H01L 41/053* (2013.01); *H01L 41/083* (2013.01); *H01L 41/0926* (2013.01)

(56) References Cited

U.S. PATENT DOCUMENTS

| | | | | |
|---|---|---|---|---|
| 2005/0249487 | A1* | 11/2005 | Gutierrez | G02B 7/102 396/85 |
| 2007/0103555 | A1* | 5/2007 | Eromaki | H04N 5/2254 348/208.4 |
| 2007/0279497 | A1* | 12/2007 | Wada | G03B 5/00 348/208.7 |
| 2011/0199530 | A1 | 8/2011 | Kosaka et al. | |
| 2012/0075519 | A1* | 3/2012 | Blasch | G02B 7/102 348/340 |
| 2016/0011393 | A1* | 1/2016 | Kim | G02B 7/08 359/698 |
| 2016/0205325 | A1* | 7/2016 | Kawai | G02B 7/02 348/208.11 |

FOREIGN PATENT DOCUMENTS

| | | |
|---|---|---|
| JP | 2005-351917 | 12/2005 |
| JP | 2006-209029 | 8/2006 |
| JP | 2008-029062 | 2/2008 |
| JP | 2009-515209 | 4/2009 |
| JP | 2010-0170051 | 8/2010 |
| JP | 2010-210968 | 9/2010 |
| JP | 2012-226205 | 11/2012 |
| JP | 2012-232497 | 11/2012 |
| WO | WO 2010/038640 | 4/2010 |

OTHER PUBLICATIONS

International Preliminary Report on Patentability to corresponding International Patent Application No. PCT/JP2015/059159, mailed on Oct. 20, 2016 (translation)(6 pgs.).

International Search Report to International Application No. PCT/JP2015/059159, mailed on Jun. 23, 2015 (3 pgs.) with translation (2 pgs.).

Written Opinion of the International Searching Authority to International Application No. PCT/JP2015/059159, mailed on Jun. 23, 2015 (4 pgs.).

* cited by examiner

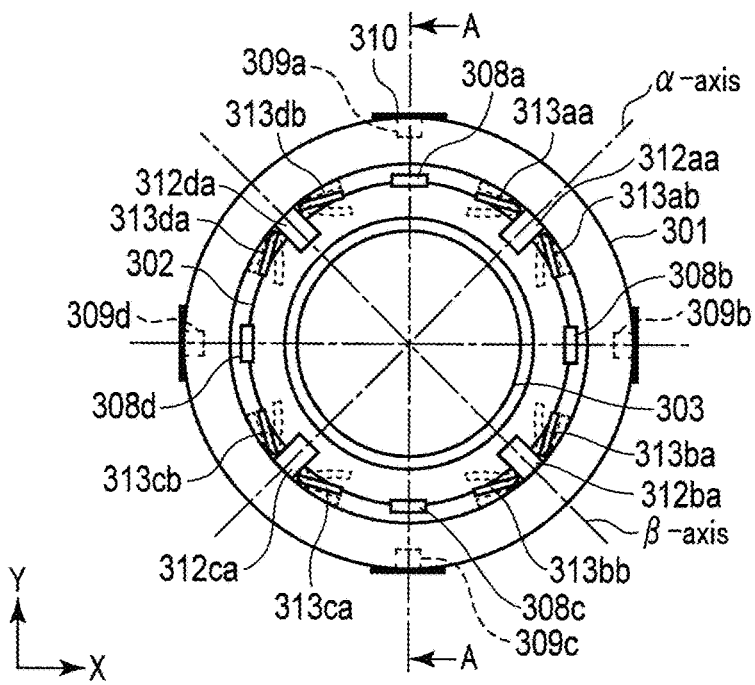
F I G. 2
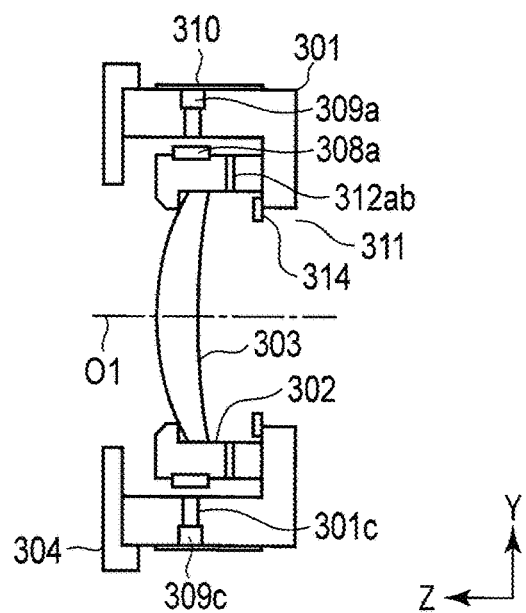
F I G. 3

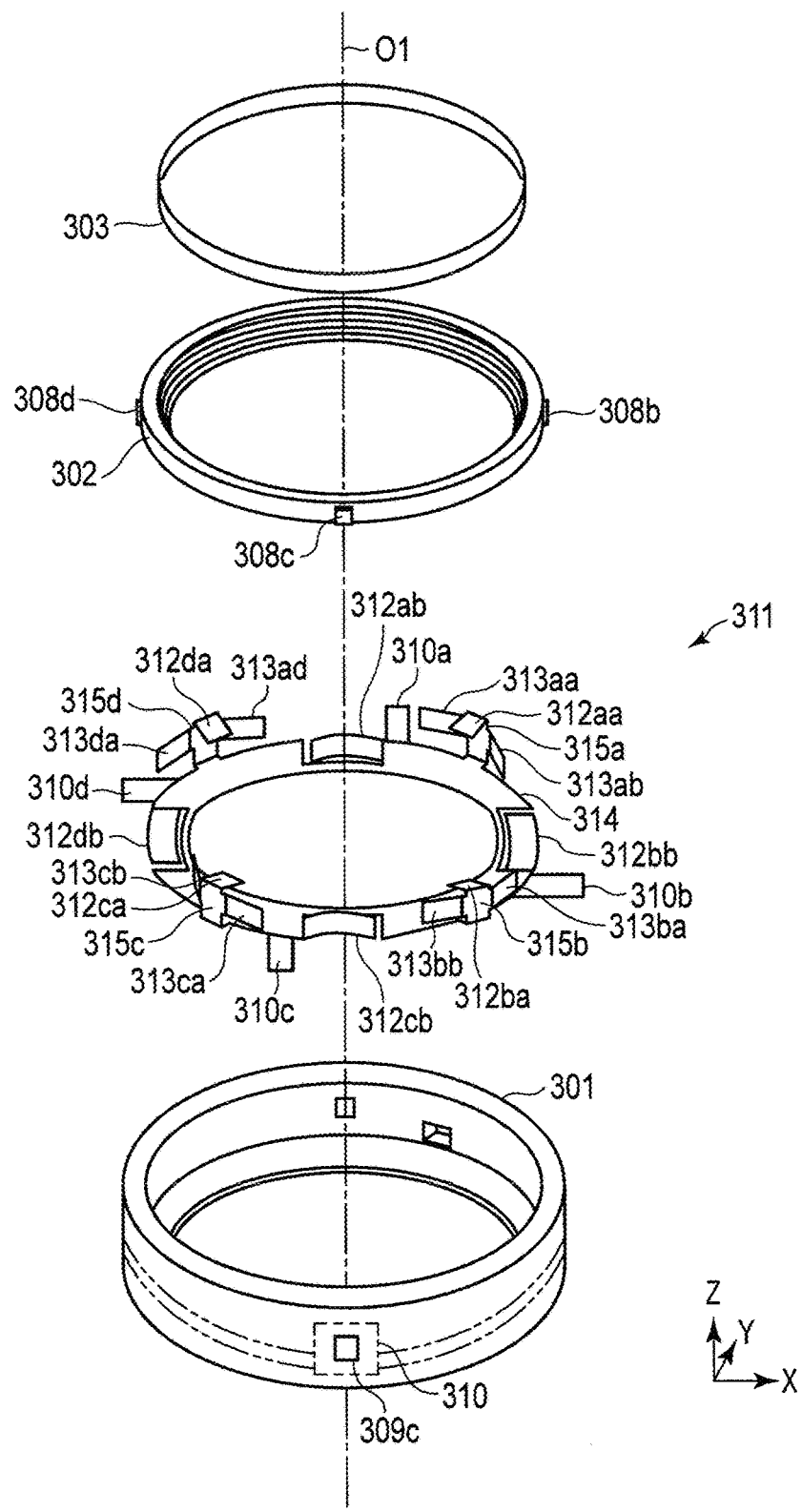
F I G. 4

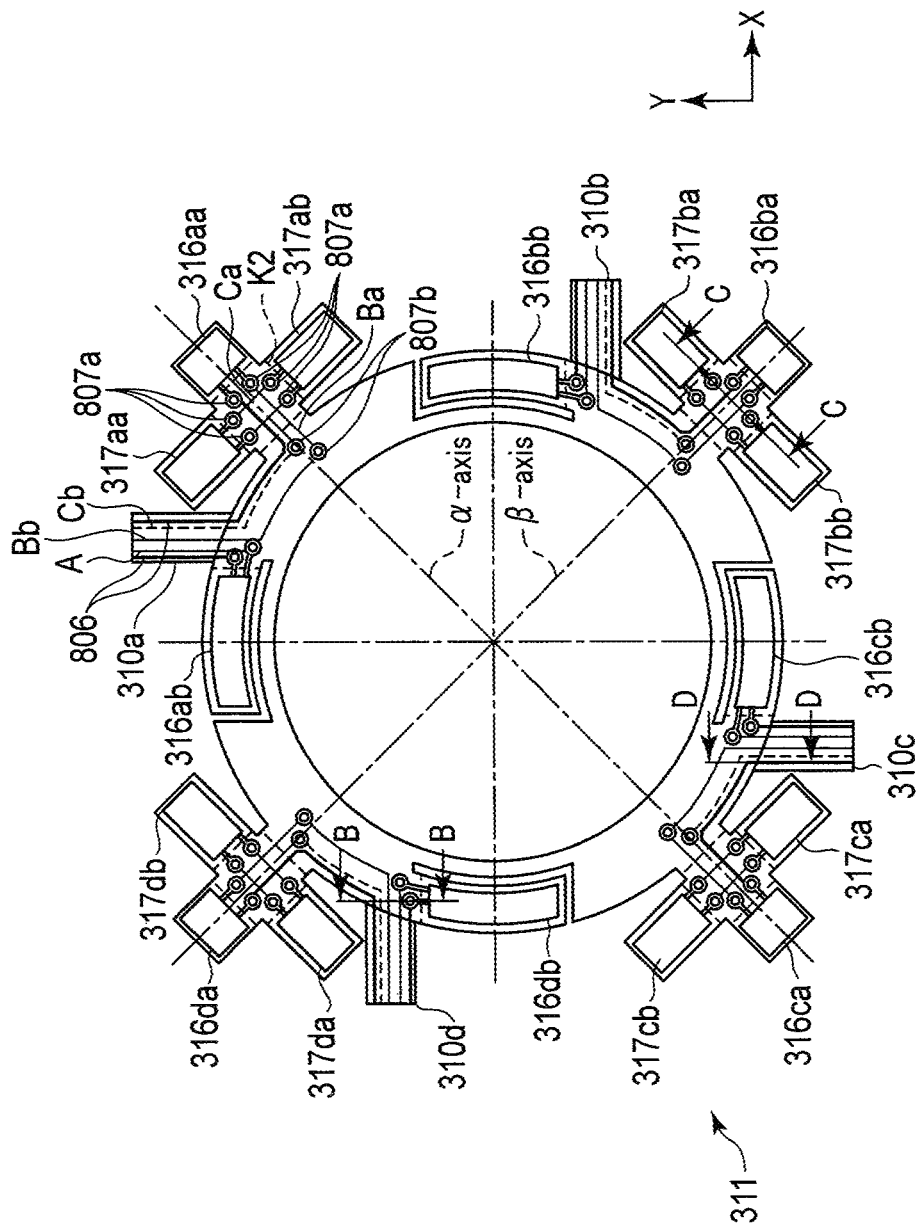
F I G. 5

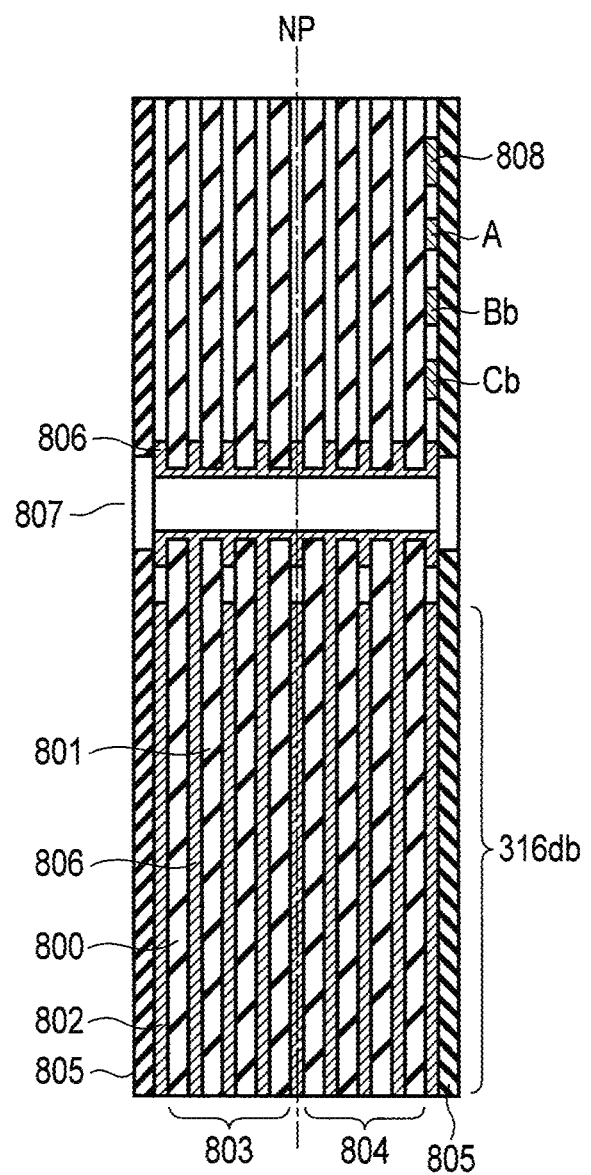
F I G. 6

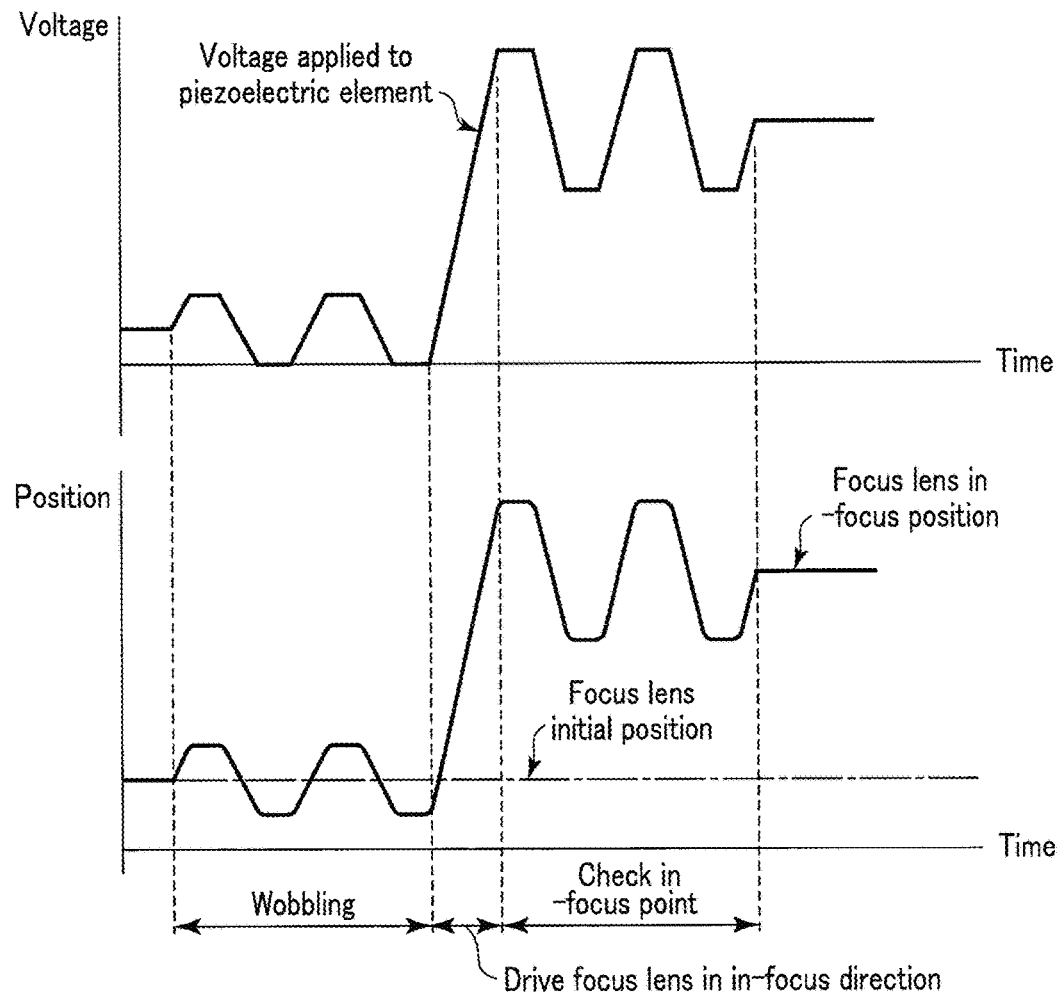
F I G. 12

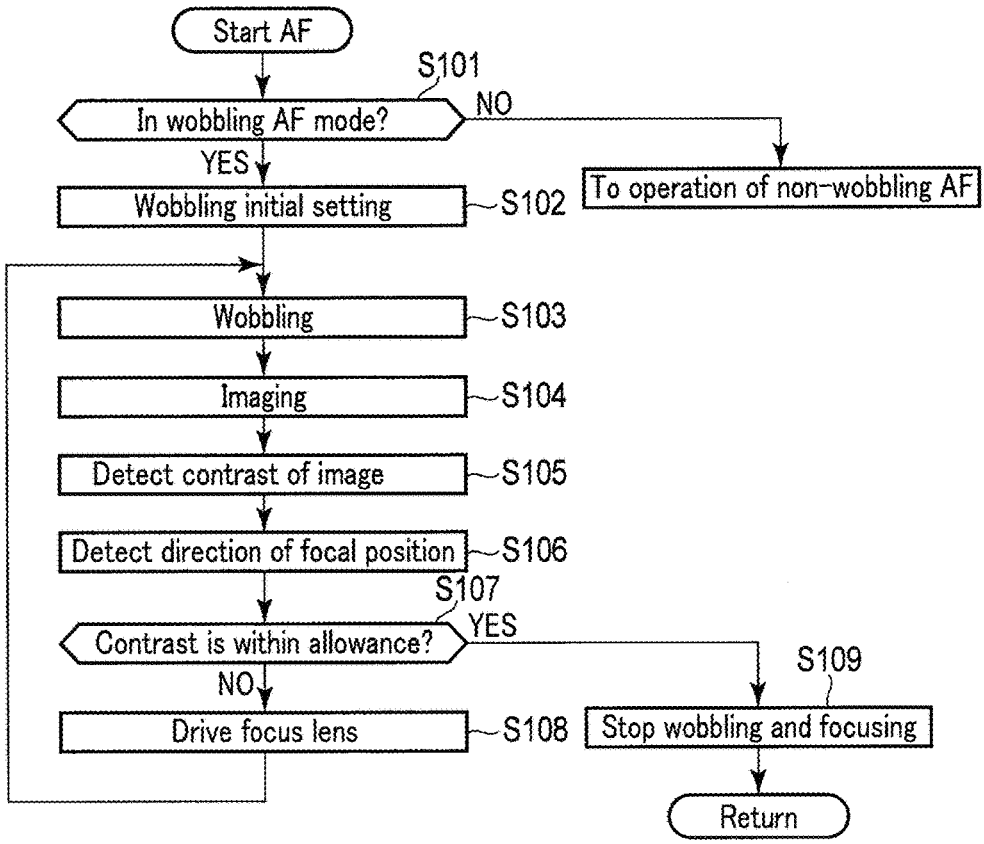
F I G. 16
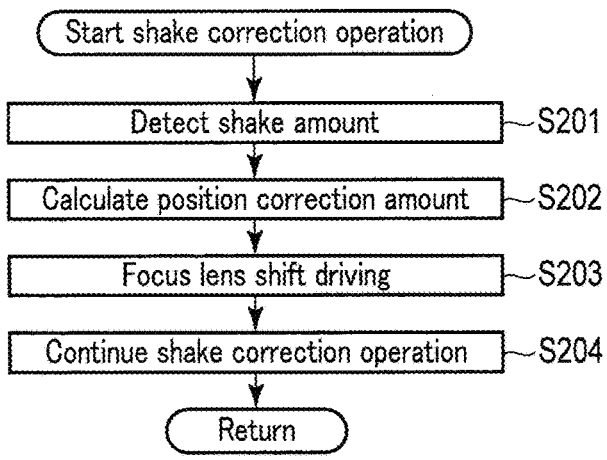
F I G. 17

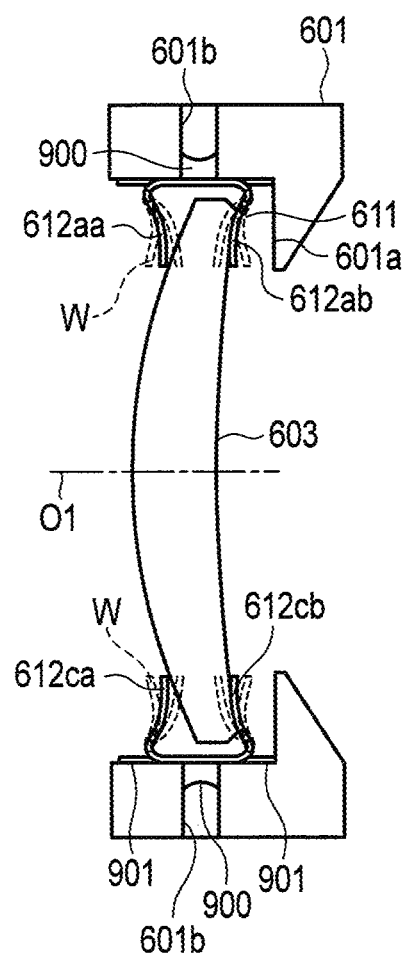
F I G. 22

DRIVER AND IMAGE INSTRUMENT

CROSS-REFERENCE TO RELATED APPLICATIONS

This application is a Continuation application of PCT Application No. PCT/JP2015/059159, filed Mar. 25, 2015 and based upon and claiming the benefit of priority from the prior Japanese Patent Application No. 2014-079660, filed Apr. 8, 2014, the entire contents of both of which are incorporated herein by reference.

BACKGROUND OF THE INVENTION

1. Field of the Invention

The present invention relates to a driver and an image instrument which uses the driver, the driver driving a movable frame which is included a photographic lens and is driven for an image blur correction and focusing during imaging or which is included a camera and is a movable frame (moving frame, lens) holding a lens constituting the photographic lens.

2. Description of the Related Art

Recently, digital cameras which enable not only still image photography but also moving image photography have been on the market. When autofocus is performed in the photographic lens or a camera, a movable frame which holds some lenses that constitute the photographic lens or which holds an image pickup device is driven in the optical axis direction of the photographic lens. When a shake correction is made in the photographic lens or the camera, the frame which holds the lenses or the image pickup device is moved in a direction that intersects at right angles with the optical axis direction or inclined in the direction that intersects at right angles with the optical axis direction.

To move the movable frame which holds the photographic lens in the optical axis direction or in the direction that intersects at right angles with the optical axis direction in this way, independent drivers are needed to move the movable frame in each direction. Thus, in an image instrument such as a camera, the configuration is complicated and increased in size.

The movable frame which holds the photographic lens needs to be driven rapidly and precisely (with high positional precision) to accurately utilize a photographing opportunity. An electromagnetic motor such as a stepping motor or a voice coil motor is generally used to rapidly drive the movable frame.

However, the problem of these motors is that the motors oscillate and become uncontrollable in rapid driving at a predetermined velocity or more. Another problem of these motors is that if minute driving is attempted to drive the motors precisely (with high positional precision), driving with a predetermined drive amount or less for this minute driving is impossible.

Techniques associated with the above autofocus and shake correction are disclosed in, for example, Jpn. Pat. Appln. KOKAI Publication No. 2010-170051, Jpn. Pat. Appln. KOKAI Publication No. 2005-351917, Jpn. Pat. Appln. KOKAI Publication No. 2006-209029, Jpn. Pat. Appln. KOKAI Publication No. 2012-232497, and Jpn. Pat. Appln. KOKAI Publication No. 2012-226205. Jpn. Pat. Appln. KOKAI Publication No. 2010-170051 discloses that a subject is imaged with what is known as wobbling in which a focus lens is vibrated in the optical axis direction, and a focal position is evaluated from an image by the imaging to drive the focus lens to the in-focus position. In the wobbling, a stepping motor is driven to wobble the focus lens.

Jpn. Pat. Appln. KOKAI Publication No. 2005-351917 discloses a driver which moves an image pickup device by a voice coil motor in a direction along a surface that intersects at right angles with the optical axis.

Jpn. Pat. Appln. KOKAI Publication No. 2006-209029 discloses driving a focus lens frame in the optical axis direction by a rectangular stack bimorph type piezoelectric element made of a ceramic material.

Jpn. Pat. Appln. KOKAI Publication No. 2012-232497 discloses a piezoelectric stack film made of a polylactic acid.

Jpn. Pat. Appln. KOKAI Publication No. 2012-226205 discloses a driver which uses a voice coil motor for driving an image pickup device in two directions (X-direction and Y-direction) that intersect at right angles with each other in a plane that intersects at right angles with the optical axis of a photographic lens and driving an image pickup device in a rotation direction around the optical axis. The driver further drives the image pickup device in the optical axis direction by a piezoelectric body.

BRIEF SUMMARY OF THE INVENTION

According to a first aspect of the invention a driver comprises: a piezoelectric sheet including at least one first piezoelectric body portion which bends in a first direction, at least one second piezoelectric body portion which bends in a second direction that intersects at right angles with the first direction, and at least one connection portion which connects the first piezoelectric body portion and the second piezoelectric body portion; a fixing frame to which the at least one connection portion is fixed; a moving frame which is supported on the first piezoelectric body portion and the second piezoelectric body portion; and a control circuit which applies voltage signals to the first piezoelectric body portion and the second piezoelectric body portion to bend the first piezoelectric body portion and the second piezoelectric body portion and which moves the moving frame in one of the first direction and the second direction or in a composite direction of the first direction and the second direction.

According to a second aspect of the invention a driver comprises: a stack resin sheet formed by fixedly connecting a first resin sheet which is displaced in at least a first direction that intersects at right angles with a thickness direction and second resin sheet which is displaced in a second direction opposite to the first direction, the stack resin sheet comprising a first displacement portion which is bent in at least a third direction different from the first and second directions, and a second displacement portion which is bent and displaced in a fourth direction that intersects at right angles with the third direction; piezoelectric body portions which respectively apply voltage signals to the first and second displacement portions; a connection portion which connects each of first ends of the piezoelectric body portions; a fixing frame to which the connection portion is fixed; a moving frame which is supported on second ends of the piezoelectric body portions different from the first ends; and a control circuit which applies voltage signals to the piezoelectric body portions to bend each of the piezoelectric body portions and which displaces the moving frame relative to the fixing frame.

According to a third aspect of the invention an image instrument comprises: an image pickup device or an optical element; a stack resin sheet formed by fixedly connecting a first resin sheet which is displaced in at least a first direction that intersects at right angles with a thickness direction and a second resin sheet which is displaced in a second direction opposite to the first direction, the stack resin sheet comprising a first displacement portion which is bent in at least a third direction different from the first and second directions, and a second displacement portion which is bent and displaced in a fourth direction that intersects at right angles with the third direction; piezoelectric body portions which respectively apply voltage signals to the first and second displacement portions; a connection portion which connects each of first ends of the piezoelectric body portions; a fixing frame to which the connection portion is fixed; a moving frame which is supported on second ends of the piezoelectric body portions different the first ends and which holds the image pickup device or the optical element; and a control circuit which applies voltage signals to the piezoelectric body portions to bend each of the piezoelectric body portions and which displaces the moving frame relative to the fixing frame.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 2 is a front view illustrating the configuration of a focus/shake correction mechanism of the interchangeable lens;

FIG. 3 is a sectional side view taken along the line A-A showing the focus/shake correction mechanism shown in FIG. 2;

FIG. 4 is an exploded perspective view illustrating the structure of the focus/shake correction mechanism shown in FIG. 2;

FIG. 5 is a development diagram illustrating the structure of a piezoelectric sheet shown in FIG. 4;

FIG. 6 is a sectional side view taken along the line B-B illustrating the detailed structure of the piezoelectric sheet shown in FIG. 5;

FIG. 12 is a time chart illustrating the operation of the focus lens by a voltage signal applied to the piezoelectric sheet during focusing;

FIG. 16 is a flowchart illustrating the operation of autofocus;

FIG. 17 is a flowchart illustrating a shake correction operation;

FIG. 22 is a sectional side view taken along the line F-F of the focus/shake correction mechanism in FIG. 20.

DETAILED DESCRIPTION OF THE INVENTION

First Embodiment

Figure 1:
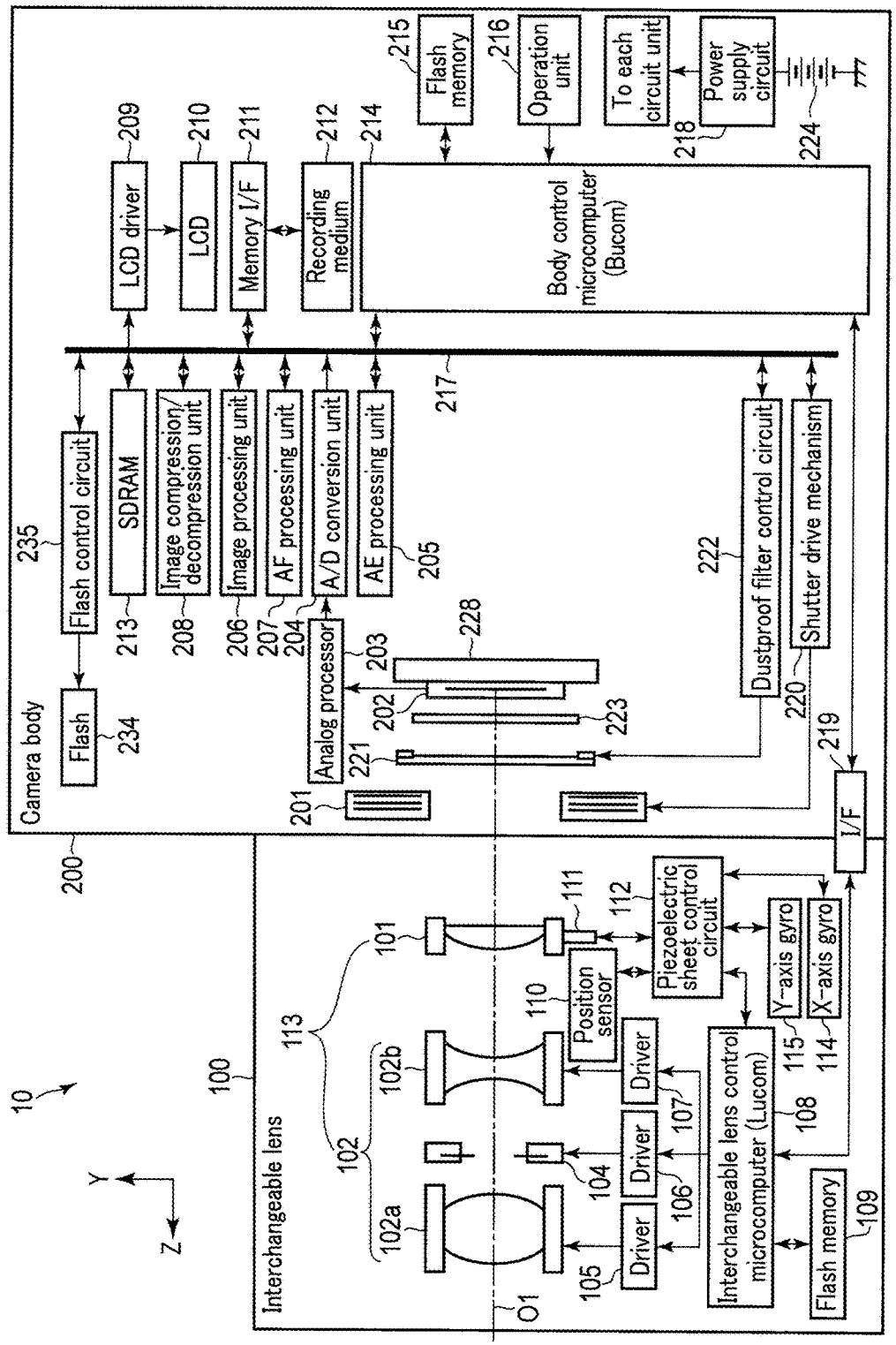
FIG. 1 is a configuration diagram showing a camera system including an interchangeable lens equipped with a first embodiment of a driver according to the present invention.

Hereinafter, a first embodiment of the present invention will be described with reference to the drawings. In each of the drawings used in the following explanation, each component has a different scale so that the size of each component can be recognized on the drawings. The present invention is not limited solely to the number of components, the shapes of the components, the ratio of the sizes of the components, and the positional relation between the components shown in the drawings below.

FIG. 1 shows a block diagram of a configuration example of a camera system (digital camera) 10 to which an operational device according to the present embodiment of the present invention is applied. In this camera system 10, a direction from a camera body 200 toward a subject is referred to as the front, and the opposite direction is referred to as the rear. An axis corresponding to an optical axis O1 of an optical system constituted by an interchangeable lens 100 is a Z-axis, and two axes that intersect at right angles with each other in a plane that intersects at right angles with the Z-axis are an X-axis and a Y-axis or are an α-axis and a β-axis.

This camera system 10 includes the interchangeable lens 100 and the camera body 200. The interchangeable lens 100 and the camera body 200 are connected to be able to communicate via an I/F 219.

The interchangeable lens 100 includes a photographic lens 113 which forms a subject image, drivers 105, 106, and 107, a lens control microcomputer (hereinafter referred to as an "Lucom") 108, a flash memory 109, a position sensor 110, an X-axis gyro 114, a Y-axis gyro 115, a piezoelectric sheet 111 (constituted by later-described piezoelectric body portions), and a piezoelectric sheet control circuit 112.

The photographic lens 113 includes a focus lens 101, a variable power lens 102, and a diaphragm 104.

The driver 106 drives and controls a diaphragm blade that constitutes the diaphragm 104.

The drivers 105 and 107 drive and control the variable power lens 102 in the optical axis direction.

The Lucom 108 communicates with a body control microcomputer (hereinafter referred to as a "Bucom") 214 via the I/F 219 to control control circuits in the interchangeable lens 100.

Information necessary for the control of the control circuits in the interchangeable lens 100 is stored in the flash memory 109.

The position sensor 110 detects the position of the focus lens 101 for focusing and a shake correction.

The X-axis gyro 114 detects an angular velocity around the X-axis which is a camera shake amount.

The Y-axis gyro 115 detects an angular velocity around the Y-axis.

The piezoelectric sheet 111 drives the focus lens 101 in the optical axis O1 direction and in an in-plane direction that intersects at right angles with the optical axis O1 direction.

The piezoelectric sheet control circuit 112 generates an electric signal for driving the piezoelectric sheet 111.

The camera body 200 includes a shutter 201, a dust-proof filter 221, an optical low pass filter 223 (which is mounted when needed and which may be dispensed with), an image pickup device 202, a holder 228, an analog processing unit 203, an analog/digital conversion unit (hereinafter referred to as an "A/D conversion unit") 204, an AE processing unit 205, an image processing unit 206 which subjects a taken image to image processing and then outputs image information to be finally output, an AF processing unit 207, an image compression/decompression unit 208, an LCD driver 209, a memory interface (hereinafter referred to as a "memory I/F") 211, an SDRAM 213, the Bucom 214, a flash memory 215, an operation unit 216, a battery 224, and an electric power supply circuit 218.

The shutter 201 drives and controls a shutter blade by a shutter drive mechanism 220 to control exposure at the time of imaging.

The dust-proof filter 221 is ultrasonically vibrated by a dust-proof filter control circuit 222 to remove dust that appears in images.

The optical low pass filter 223 removes a component having a high spatial frequency in an optical image created by the photographic lens 113.

The image pickup device 202 converts the optical image formed by the photographic lens 113 into an analog electric signal.

The holder 228 holds the image pickup device 202 and is thus attached to a fixing member of the camera body 200.

The analog processing unit 203 performs analog processing such as noise reduction on the electric signal converted and output by the image pickup device 202.

The A/D conversion unit 204 converts an analog output of the analog processing unit 203 into a digital image signal.

The AE processing unit 205 performs light-metering from the subject to output information for controlling the exposure of the image at the time of photography.

The image processing unit 206 subjects the taken image to image processing and then outputs image information to be finally output.

The AF processing unit 207 detects an in-focus position of the optical image formed by the photographic lens and then outputs information for controlling focus.

The image compression/decompression unit 208 compresses information on the taken image or decompresses compressed information into original information.

The LCD driver 209 controls an LCD 210 which displays the taken image or, for example, information at the time of photography.

The memory I/F 211 records the taken image or the information at the time of photography in a recording medium 212 or calls the taken image or the information at the time of photography from the recording medium 212.

Information regarding, for example, the taken image is temporarily stored in the SDRAM 213.

The Bucom 214 controls electric circuits in the camera system through, for example, a bus 217.

Information for control and others are stored in the flash memory 215.

The operation unit 216 comprises, for example, a release button, a dial, and a button for the operation of the camera body 200.

The camera body 200 includes a built-in flash 234, and a flash control circuit 235 which controls the lighting of the flash 234 in accordance with an instruction from the Bucom 214.

The Lucom 108 is one control circuit for controlling the control circuits in the interchangeable lens 100, and the Bucom 214 is one control circuit for controlling the electric circuits in the camera system 10. Some other means may be used for control.

The focus lens 101 focuses the optical image of the subject on a light receiving surface of the image pickup device 202. The variable power lens 102 changes the focal distance of the photographic lens 113 and thereby changes the magnification of the optical image of the subject. It should be understood that the interchangeable lens 100 may be configured so that the focus lens 101 is also operated when the magnification of the optical image is changed.

The focus lens 101 comprises a movable frame 302, and a lens 303 held by the movable frame 302. The focus lens 101 may comprise the lens alone without the movable frame 302 and directly hold the lens by a piezoelectric sheet 311.

The lens 303 comprises a convex lens. The lens 303 may be an optical element such as a concave lens or a diffraction grating if it can change, by its operation, the focal position of the photographic lens 113 or if it can be displaced in a direction that intersects at right angles with the optical axis of the optical image on the image pickup device 202, or the lens 303 may comprise more than one optical element.

Although the focus lens 101 and the variable power lens 102 are shown as single lenses in FIG. 1, each of the lenses may comprise multiple lenses or may include an optical element such as an optical filter.

Instead of the focus lens 101, the variable power lens 102 or the lens that constitutes the variable power lens may be vibrationally displaced in the optical axis direction for what is known as wobbling in which the focal position of the photographic lens 113 is vibrationally displaced.

In the meantime, in the shake correction, an angular velocity signal corresponding to a camera shake detected by the X-axis gyro 114 and the Y-axis gyro 115 is input to the piezoelectric sheet control circuit 112. This piezoelectric sheet control circuit 112 converts the angular velocity signal into a digital signal and then sends the digital signal to the Lucom 108.

For an optical image position correction on an imaging surface of the image pickup device 202, the Lucom 108 calculates a correction amount on the basis of this digital signal to move the focus lens 101 in plane directions (X-axis direction and Y-axis direction) that intersect at right angles with the optical axis and then indicates the correction amount to the piezoelectric sheet control circuit 112.

In response to the indication from the Lucom 108, the piezoelectric sheet control circuit 112 displaces the focus lens 101 in the X-axis direction and the Y-axis direction to make a shake correction. In this case, the optical image position on the image pickup device 202 can also be corrected by rotating the focus lens 101 around the X-axis and the Y-axis instead of moving the focus lens 101 in the X-axis direction and the Y-axis direction.

Each of the drivers 105, 106, and 107, the I/F 219, the flash memory 109, and the piezoelectric sheet control circuit 112 are connected to the Lucom 108. The position sensor 110, the X-axis gyro 114, the Y-axis gyro 115, and the piezoelectric sheet 111 are connected to the piezoelectric sheet control circuit 112.

The Lucom 108 reads and writes information stored in the flash memory 109, and controls each of the drivers 105, 106, and 107 and the piezoelectric sheet control circuit 112. The Lucom 108 communicates with the Bucom 214 via the I/F 219, and sends various kinds of information to the Bucom 214 and receives various kinds of information from the Bucom 214. For example, the Lucom 108 sends, to the Bucom 214, information corresponding to the state of an operational member (not shown) of the lens, an output signal (detection signal) of the position sensor 110, and each piece of information corresponding to the positions and state signals of the focus lens, the variable power lens, and the diaphragm. The Lucom 108 receives, for example, control information for the piezoelectric sheet control circuit 112 from the Bucom 214. Moreover, when performing autofocus or making a shake correction, the Lucom 108 controls the piezoelectric sheet control circuit 112 on the basis of the control information received from the Bucom 214.

The driver 105 drives a variable power lens 102a in response to an instruction from the Lucom 108. The driver 107 drives a variable power lens 102b in response to an instruction from the Lucom 108 and thereby changes the focal distance.

The driver 106 drives the diaphragm 104 in accordance with an instruction from the Lucom 108 and thereby adjusts the light amount of the subject. Specifically, the variable power lens 102a is driven by an unshown actuator such as a stepping motor, a VCM, or an ultrasonic motor provided in the driver 105. The variable power lens 102b is also driven by an unshown actuator such as a stepping motor, a voice coil motor (VCM), or an ultrasonic motor provided in the driver 107. Moreover, the diaphragm 104 is driven by, for example, an unshown stepping motor shown in the driver 106.

The piezoelectric sheet control circuit 112 drives the piezoelectric sheet 111 under the control of the Lucom 108. The piezoelectric sheet 111 drives the piezoelectric body portion (described later) in response to a control signal from the piezoelectric sheet control circuit 112, and controls the movement of the focus lens 101 supported at the end of the piezoelectric sheet 111. The piezoelectric sheet 111 performs wobbling which is a minute vibrating operation in the optical axis direction to detect the focal position of the photographic lens 113, or controls the position of the focus lens 101 in the optical axis direction to adjust the focus.

Furthermore, the piezoelectric sheet 111 performs positional control in a direction that intersects at right angles with the optical axis direction of the focus lens 101 in accordance with a shake correction signal output from the piezoelectric sheet control circuit 112 in response to each of shake signals from the X-axis gyro 114 and the Y-axis gyro 115. That is, the piezoelectric sheet 111 is controlled by the Lucom 108 via the piezoelectric sheet control circuit 112.

As will be described in detail later, the piezoelectric sheet 111 comprises, for example, a stacked piezoelectric sheet. The piezoelectric sheet 111 comprises a bimorph portion which is bent and displaced in the optical axis direction by the application of a voltage signal, and a bimorph portion which is bent and displaced in a direction that intersects at right angles with the optical axis.

The position sensor 110 detects the position of the focus lens 101 in the optical axis direction and the position in the direction that intersects at right angles with the optical axis direction, and converts the detection signal into a digital signal by the piezoelectric sheet control circuit 112 and then outputs the digital signal to the Lucom 108. The position sensor 110 has a detection range, precision, and a configuration that are required for the focus lens 101. As will be described in detail later, this position sensor 110 comprises, for example, a hall element which is provided to face a magnet provided in a frame constituting the focus lens 101 and which is provided in a fixing frame. It should be understood that a giant magnetoresistive element (GMR element) or an optical or electrostatic component may be used for the detection of the position of the focus lens 101. Although not shown, movable mechanisms are used in the variable power lens 102a, the variable power lens 102b, and the diaphragm 104, and respectively comprise position detection mechanisms for the detection of the position of the movable components.

The shutter 201 is driven in response to an instruction from the body control microcomputer 214, and controls the time of exposing the subject to the image pickup device 202. For example, the shutter 201 comprises two shutter curtains: a front curtain and a rear curtain. A slit formed by the two shutter curtains runs toward the short side or long side of the image pickup device 202 to perform exposure.

The image pickup device 202 comprises Bayer-arranged color filters in front of photodiodes that constitute each pixel. The Bayer arrangement includes lines in which R pixels and G (Gr) pixels are alternately arranged in a horizontal direction and lines in which G (Gb) pixels and B pixels are alternately arranged. The two types of lines are also alternately arranged in a vertical direction. The image pickup device 202 receives, by the photodiodes, light collected by the focus lens 101 and the variable power lens 102, and then photoelectrically converts the light, thereby outputting the amount of light as a charge amount to the analog processing unit 203. The image pickup device 202 may be a CMOS-type device, or may be some other type of device such as a CCD-type device.

The analog processing unit 203 reduces, for example, a reset noise included the electric signal (analog image signal) read from the image pickup device, shapes the waveform of the electric signal reduced the noise, and amplifies the electric signal to obtain desired brightness.

The bus 217 is a transfer path for transferring various data generated in the digital camera to various components inside the digital camera. The bus 217 is connected to the AE processing unit 205, the image processing unit 206, the AF processing unit 207, the image compression/decompression unit 208, the LCD driver 209, the memory I/F 211, the SDRAM 213, and the body control microcomputer 214.

The A/D conversion unit 204 converts the analog image signal output from the analog processing unit 203 into a digital image signal (hereinafter referred to as image data). The image data output from the A/D conversion unit 204 is temporarily stored in the SDRAM 213 via the bus 217.

The SDRAM 213 is a storage unit for temporarily storing various data such as the image data obtained in the A/D conversion unit 204, the image data processed in the image processing unit 206, and the image data processed in the image compression/decompression unit 208.

The image processing unit 206 performs various kinds of image processing of the image data read from the SDRAM 213. The image data after the various kinds of processing by the image processing unit 206 is stored in the SDRAM 213.

The AE processing unit 205 calculates a subject luminance from the image data. Data for calculating the subject luminance may be the output of an exclusive photometric sensor.

The AF processing unit 207 extracts a signal having a high-frequency component from the image data, and acquires an in-focus evaluation value by autofocus (AF) integrating processing. At the same time, the focus lens 101 is vibrationally driven in the optical axis direction. In this state, the AF processing unit 207 performs AF calculating processing using each of images taken at the positions where the focal position is close to the subject and far from the subject. The AF processing unit 207 acquires the in-focus evaluation value at each of the above positions. The AF processing unit 207 determines the direction where the focal position is located by comparing the in-focus evaluation values. Recognizing the direction where the focal position is located permits AF driving at a higher velocity.

The image compression/decompression unit 208 compresses the image data by a predetermined compression scheme, and decompresses (expands) the image data compressed by the predetermined compression scheme. For example, when the image data to be handled is a still image, the image compression/decompression unit 208 compresses and decompresses the image data compliant with a JPEG scheme. When the image data to be handled is a moving image, the image compression/decompression unit 208 compresses and decompresses the image data compliant with a motion-JPEG scheme or an H.264 scheme.

When recording the image data regarding the still image, the image compression/decompression unit 208 reads the image data from the SDRAM 213, and compresses the read image data in accordance with, for example, the JPEG compression scheme, and then temporarily stores the compressed JPEG image data in the SDRAM 213.

The Bucom 214 adds a JPEG header necessary to construct a JPEG file to the JPEG image data stored in the SDRAM 213 to create a JPEG file, and records the created JPEG file in the recording medium 212 via the memory I/F 211.

The recording medium 212 is, but is not limited to, a recording medium such as a memory card removable from the camera body 200.

The LCD driver 209 displays images on the LCD 210. The image display includes a rec-view display for displaying image data immediately after photography only for a short time, reproduction display of the JPEG file recorded in the recording medium 212, and moving image display such as live view display.

When reproducing the JPEG file recorded in the recording medium 212, the image compression/decompression unit 208 reads and expands (decompresses) the JPEG file recorded in the recording medium 212, and then temporarily stores the expanded image data in the SDRAM 213.

The LCD driver 209 reads the expanded image data from the SDRAM 213, and converts the read image data into a video signal, and then outputs the video signal to the LCD 210 to display an image.

The Bucom 214 has the overall control of various sequences of the camera body 200. The operation unit 216 and the flash memory 215 are connected to the Bucom 214.

The operation unit 216 includes operational components such as a power button, a release button, a reproduction button, a menu button, a moving image button, and various input keys. In the operation unit 216, any of the operational components are manually operated by the user. The Bucom 214 performs various sequences corresponding to the operation on the operation unit 216 by the user.

For example, the power button is an operational component for instructing to switch on and off the power supply of the camera system 10 which is the digital camera. When the power button is pressed, the Bucom 214 switches on or off the power supply of the camera system 10. The release button includes a double switch having a first release switch and a second release switch. When the first release switch is turned on by half-pressing of the release button, the Bucom 214 performs a photography preparing sequence including, for example, AE processing and AF processing. When the second release switch is turned on by full-pressing of the release button, the Bucom 214 performs a photography sequence to conduct photography. The reproduction button is an operational component for instructing to reproduce a file recorded in the recording medium. 212. When the reproduction button is pressed, the Bucom 214 performs a reproduction sequence to perform reproduction. The menu button is an operational component for instructing to display a menu which enables a camera setting to be changed. When the menu button is pressed, the Bucom 214 performs a camera setting sequence to conduct, for example, menu display. The moving image button is an operational member for giving a moving image photography instruction. When the moving image button is pressed, the Bucom 214 performs a moving image photography sequence to conduct moving image photography.

The flash memory 215 stores various parameters necessary for the operation of the digital camera, such as a white balance gain corresponding to a white balance mode and a low pass filter coefficient, image data regarding a granular pattern resembling a granular feel obtained by silver halide grains, and a serial number for the identification of the digital still camera. The flash memory 215 also stores various programs to be executed in the Bucom 214. In accordance with the program stored in the flash memory 215, the Bucom 214 reads parameters necessary for various sequences from the flash memory 215, and performs various kinds of processing.

The camera system 10 performs wobbling to vibrationally operate the focus lens 101 in the optical axis direction for focal position detection in an AF operation. The frequency of the wobbling generally corresponds to the frequency at which the camera system 10 performs imaging per second. The wobbling frequency is 30 frames or more per second in a camera system capable of taking moving images, and wobbling is performed at 30 Hz or more. However, a time of about 33 ms is taken at the minimum for one detection at a wobbling frequency of 30 Hz, and if this frequency is not increased, the AF operation cannot be accelerated.

Therefore, it is necessary not only to increase the frequency of imaging but also to increase the wobbling frequency. Increasing the wobbling frequency leads to driving the focus lens 101 at a higher velocity. It should be understood that driving the focus lens 101 at a high velocity is also needed to adjust the focus.

Although the focal position of the photographic lens 113 is detected from the contrast of the taken image during the wobbling operation, the taken image is displayed on the LCD 210 and observed by the photographer as a finder image in the digital camera 10. If the amount of the wobbling operation is increased too much, image blur is increased and reaches an impermissible level.

$$d = F \cdot \delta \quad (1)$$

wherein $\delta$ is a permissible diameter of the circle of confusion, F is the aperture value (effective F number) of the photographic lens 113, and d is the focal depth.

A wobbling drive amount dw is generally said to be ¼ to ¾ of the focal depth d, and therefore has the following relation:

$$F \cdot \delta/4 \leq dw \leq 3 \cdot F \cdot \delta/4 \quad (2).$$

The diameter of the circle of confusion $\delta$ is equal to or more than a pixel pitch at the minimum because the image cannot be resolved when the diameter of the circle of confusion $\delta$ is less than or equal to the pixel pitch of the image pickup device 202. The upper limit is generally said to be four pixels or less. That is, $$p \leq \delta \leq 4 \cdot p \quad (3)$$

wherein p is the pixel pitch.

More specifically, if the pixel pitch p=5 μm and the aperture value F=8, the wobbling drive amount dw is 10 μm ≤ dw ≤ 120 μm, which shows that a maximum drive amount of about 120 μm has only to be secured.

To produce a displacement of about 120 μm by the application of a direct-current voltage in a bimorph type plate-shaped piezoelectric body made of a ceramic material, the length of this plate-shaped piezoelectric body needs to be greater. For example, if the focus lens 101 having a mass of 5 g is driven at a wobbling frequency of 120 Hz, the force required to control the focus lens 101 is 0.1 Newtons (N) to 0.2 N. To generate this force to obtain a displacement width of 120 μm necessary for wobbling, it is possible to use a soft-type ceramic piezoelectric body material having a large displacement amount, and it is also possible to use four piezoelectric bodies as in the present embodiment as will be further described later.

However, even if the four piezoelectric bodies are used, the shape of one piezoelectric body bimorph requires a size including a width of 6 mm, a thickness of 0.8 mm, and a length of 40 mm (without the length for supporting member and fixing member). If focusing is also taken into consideration, the ceramic piezoelectric material cannot permit a practical level of force necessary for the control of the focus lens 101 to be obtained. Ceramics are fragile and therefore need to be reinforced. If ceramics are reinforced, energy is needed to deform a reinforcing material, resulting in a lower generative force and a smaller displacement amount.

Now, the detailed configuration of a drive mechanism of the focus lens 101 provided in the interchangeable lens 100 is described with reference to FIG. 2, FIG. 3, FIG. 4, and FIG. 5.

FIG. 2 shows a front view of the overview of the principal parts in which the drive mechanism of the focus lens 101 is seen from the subject side. FIG. 3 shows a sectional side view taken along the line A-A in FIG. 2. FIG. 4 shows an exploded perspective view of the drive mechanism in FIG. 2. FIG. 5 shows a developed front diagram in which the piezoelectric sheet shown in FIG. 4 is expanded.

The drive mechanism of the focus lens 101 comprises a circular cylindrical fixing frame 301, the circular-ring-shaped piezoelectric sheet 311, and the movable frame 302 provided with the lens 303 that constitutes the focus lens 101.

Bent portions 315a, 315b, 315c, and 315d (hereinafter referred to as 315a/315d) are formed in the piezoelectric sheet 311. Each of the bent portions 315a/315d is fixedly connected to the fixing frame 301.

The piezoelectric sheet 311 includes the bent portions 315a/315d, Z-displacement portions (displacement portions on one side) 312ab, 312bb, 312cb, and 312db (hereinafter referred to as 312ab/312db), Z-displacement portions (Z-displacement portions on the other side) 312aa, 312ba, 312ca, and 312da (hereinafter referred to as 312aa/312da), and arm portions 313aa and 313ab, 313ba and 313bb, 313ca and 313cb, and 313da and 313db (hereinafter referred to as 313aa and 313ab/313da and 313db).

The Z-displacement portions 312ab/312db on one side and the Z-displacement portions 312aa/312da on the other side are included to form the whole Z-displacement portion.

Each of the Z-displacement portions 312ab/312db on one side is formed in a direction that intersects substantially at right angles with each of the bent portions 315a/315d, extends in a circumferential direction from a part of a circular-ring-shaped annular portion 314, and is further formed to bend in the direction of the optical axis O1.

Each of the Z-displacement portions 312aa/312da on the other side is folded substantially at right angles from one end of each of the bent portions 315a/315d, and is formed to extend to the central side of the optical axis O1 from the folded part.

The Z-displacement portions 312ab/312db and the Z-displacement portions 312aa/312da hold the movable frame 302 in the direction of the optical axis O1.

Pairs of arm portions 313aa and 313ab/313da and 313db extend along the circumferential directions of the bent portions 315a/315d, respectively. For example, a pair of arm portions 313aa and 313ab are arranged to face each other line-symmetrically with respect to the α-axis as shown in FIG. 2, and are rotatable in a direction in which the arm portions 313aa and 313ab face each other line-symmetrically with respect to the α-axis. That is, a pair of arm portions 313aa and 313ab are provided at both ends of the bent portion 315a, that is, at both ends of the circular-ring-shaped piezoelectric sheet 311 in the circumferential direction. Each of the arm portions 313aa and 313ab rotates on both ends of the bent portion 315a in the circumferential direction in a direction in which these arm portions face each other.

Similarly, a pair of arm portions 313ba and 313bb are provided at both ends of the bent portion 315b, and rotate on both ends of the bent portion 315b in the circumferential direction in a direction in which these arm portions face each other. A pair of arm portions 313ca and 313cb are also provided at both ends of the bent portion 315c, and rotatable on both ends of the bent portion 315c in the circumferential direction in a direction in which these arm portions face each other. A pair of arm portions 313da and 313db are provided at both ends of the bent portion 315d, and rotate on both ends of the bent portion 315*d* in the circumferential direction in a direction in which these arm portions face each other.

Thus, the movable frame 302 is held to the Z-displacement portions 312*ab*/312*db* on one side and the Z-displacement portions 312*aa*/312*da* on the other side. Therefore, the lens 303 used for focusing is provided in the movable frame 302, and is therefore driven in the direction of the optical axis O1 (hereinafter referred to as the optical axis O1 direction) by the displacement of the Z-displacement portions 312*ab*/312*db* on one side and the displacement of the Z-displacement portions 312*aa*/312*da* on the other side, and positioned and held.

In addition, the lens 303 is provided in the movable frame 302 in the same way as above, and is therefore driven in a direction that intersects at right angles with the optical axis O1 by the rotation of each of the arm portions 313*aa* and 313*ab*/313*da* and 313*db*, and positioned and held.

The annular portion 314 of the piezoelectric sheet 311 is a part which is not displaced even if an electric signal is input to the piezoelectric sheet 311. The annular portion 314 is attached and fixed to the fixing frame 301 to ensure that the piezoelectric sheet 311 is fixed to the fixing frame 301.

Piezoelectric body portions 317*aa*, 317*ab*, 317*ba*, 317*bb*, 317*ca*, 317*cb*, 317*da*, and 317*db* are respectively formed in the arm portions 313*aa* and 313*ab*/313*da* and 313*db* of the piezoelectric sheet 311.

Four piezoelectric body portions 316*ab*, 316*bb*, 316*cb*, and 316*db* (hereinafter referred to as 316*ab*/316*db*) are respectively formed in the Z-displacement portions 312*ab*/312*db* on one side.

Four piezoelectric body portions 316*aa*, 316*ba*, 316*ca*, and 316*da* (hereinafter referred to as 316*aa*/316*da*) are respectively formed in the Z-displacement portions 312*aa*/312*da* on the other side.

Each of these piezoelectric body portions 317*aa*, 317*ab*, 317*ba*, 317*bb*, 317*ca*, 317*cb*, 317*da*, 317*db*, 316*ab*, 316*bb*, 316*cb*, 316*db*, 316*aa*, 316*ba*, 316*ca*, and 316*da* is formed into a substantially rectangular shape, and is bent by the application of a voltage signal.

Now, the operations and functions of the Z-displacement portions 312*ab*/312*db* on one side, the Z-displacement portions 312*aa*/312*da* on the other side, and the arm portions 313*aa* and 313*ab*/313*da* and 313*db* are described.

The Z-displacement portions 312*ab*/312*db* on one side support the rear end face of the movable frame 302.

The Z-displacement portions 312*aa*/312*da* on the other side support the front end face of the movable frame 302.

If voltage signals are applied to the four piezoelectric body portions 316*ab*/316*db* provided in the Z-displacement portions 312*ab*/312*db* on one side and the four piezoelectric body portions 316*aa*/316*da* provided in the Z-displacement portions 312*aa*/312*da* on the other side so that the piezoelectric body portions 316*ab*/316*db* and the piezoelectric body portions 316*aa*/316*da* bend in the same direction in the optical axis O1 direction, the movable frame 302 is driven in the optical axis O1 direction (Z-axis direction). Although four Z-displacement portions 312*aa*/312*da* and four Z-displacement portions 312*ab*/312*db* are respectively provided here, one or more displacement portions has only to be respectively provided if the movable frame 302 can be positioned in the optical axis O1 direction (Z-axis direction).

On the other hand, the arm portions 313*aa*, 313*ab*, 313*ca*, 313*cb*, 313*ba*, 313*bb*, 313*da*, and 313*db* support the outer circumferential surface of the movable frame 302 in the direction that intersects at right angles with the optical axis O1. The arm portions 313*aa*, 313*ab*, . . . , and 313*db* comprise the arm portions 313*aa*, 313*ab*, 313*ca*, and 313*cb* that support in the α-axis direction, and the arm portions 313*ba*, 313*bb*, 313*da*, and 313*db* that support in the β-axis direction.

If voltage signals are applied so that each of the piezoelectric body portions 317*aa*, 317*ab*, 317*ca*, and 317*cb* bends in the same α-axis direction, the movable frame 302 is driven in the α-axis direction.

If voltage signals are applied so that each of the piezoelectric body portions 317*ba*, 317*bb*, 317*da*, and 317*db* bends in the same β-axis direction, the movable frame 302 is driven in the β-axis direction.

The bending amounts of each of the piezoelectric body portions 317*aa*, 317*ab*, 317*ca*, and 317*cb* and each of the piezoelectric body portions 317*ba*, 317*bb*, 317*da*, and 317*db* change in accordance with the voltage signals applied to each of the piezoelectric body portions 317*aa*, 317*ab*, 317*ca*, and 317*cb* and each of the piezoelectric body portions 317*ba*, 317*bb*, 317*da*, and 317*db*. Thus, the positions of the movable frame 302 in the α-axis direction and the β-axis direction can be controlled by changing the value of each of the voltages applied to each of the piezoelectric body portions 317*aa*, 317*ab*, 317*ca*, and 317*cb* and each of the piezoelectric body portions 317*ba*, 317*bb*, 317*da*, and 317*db*.

The α-axis and the β-axis intersect at right angles with each other in a plane that intersects at right angles with the optical axis O1, so that if the α-axis and the β-axis are arranged in the X-axis direction (a shake detection direction of the Y-axis gyro 115) and the Y-axis direction (a shake detection direction of the X-axis gyro 114), there is almost no interference caused by the driving in the mutual axis directions, and the movable frame 302 can be freely driven in the X-axis direction and the Y-axis direction.

The piezoelectric sheet control circuit 112 can accurately drive the focus lens 101 on the basis of the shake amounts detected by the X-axis gyro 114 and the Y-axis gyro 115.

Although two of the arm portions 313*aa*, 313*ab*, 313*ca*, and 313*cb* and the arm portions 313*ba*, 313*bb*, 313*da*, and 313*db* are formed in one bent portion 315*a*, 315*b*, 315*c*, or 315*d*, one or more arm portions have only to be respectively provided in one bent portion 315*a*, 315*b*, 315*c*, or 315*d*.

The arm portions 313*aa*, 313*ab*, 313*ca*, and 313*cb* are not exclusively located at angular positions that divide the outer circumference of the movable frame 302 into four equal parts, and may be located at angles that divide the outer circumference of the movable frame 302 into unequal parts. Moreover, if three or more arm portions 313*aa*, 313*ab*, 313*ca*, and 313*cb* are arranged on the outer circumference, the movable frame 302 can be freely driven in the X-axis direction and the Y-axis direction. The piezoelectric sheet 311 may be fixed not only by adhesive bonding but also by screws or welding.

In the drive mechanism of the focus lens 101 having the above configuration, the focus lens 101 is driven by each of the piezoelectric body portions 316*aa*, 316*ba*, 316*ca*, 316*da*, 316*ab*, 316*bb*, 316*cb*, and 316*db* that drive in the Z-axis direction, each of the piezoelectric body portions 317*aa*, 317*ab*, 317*ca*, and 317*cb* that drive in the α-axis direction, and each of the piezoelectric body portions 317*ba*, 317*bb*, 317*da*, and 317*db* that drive in the β-axis direction. In this case, each of scales 308*a*, 308*b*, 308*c*, and 308*d* comprising plate-shaped rectangular magnets magnetized in the thickness direction are fixed to the outer circumferential part of the movable frame 302 to detect the positions of the focus lens 101 in the optical axis O1 direction, the α-axis direction, and the β-axis direction. On the fixing frame 301, position sensors 309*a*, 309*b*, 309*c*, and 309*d* in which hall elements for detecting magnetism are arranged are arranged to face the scales 308a, 308b, 308c, and 308d.

In one position sensor 309a, 309b, 309c, or 309d, the hall elements are arranged to be able to detect one of the optical axis O1 direction (Z-axis direction), the X-axis direction, and the Y-axis direction.

Although four sets of position sensors 309a, 309b, 309c, or 309d are used, two sets have only to be used. Each of the position sensors 309a, 309b, 309c, and 309d may perform open-loop control without using each of scales 308a, 308b, 308c, and 308d and the position sensors 309a, 309b, 309c, and 309d because the movable frame 302 is displaced in accordance with the values of the voltages applied to the piezoelectric body portions 317aa, 317ab, 317ba, 317bb, 317ca, 317cb, 317da, 317db, 316ab, 316bb, 316cb, 316db, 316aa, 316ba, 316ca, and 316da.

Thus, in the first embodiment described above, if each pair of piezoelectric body portions 316aa, 316ba, 316ca, 316da, 316ab, 316bb, 316cb, and 316db that are displaced in the Z-axis direction is independently driven, the inclination of the focus lens 101 relative to the optical axis O1 is also corrected, so that wobbling and focusing can be performed with an extremely high degree of accuracy.

In addition, according to the present embodiment, it is possible to perform a shake correction operation by independently controlling each pair of piezoelectric body portions 317aa, 317ab, 317ca, and 317cb that drive in the α-axis direction and piezoelectric body portions 317ba, 317bb, 317da, and 317db that drive in the β-axis direction.

Therefore, in a small-sized image instrument such as the camera or the photographic lens, it is possible to rapidly and precisely drive and control the movable frame in a predetermined direction and in a direction that intersects at right angles with the predetermined direction in, for example, autofocus or a shake correction.

Circuit lines for applying the voltage signals to each of the piezoelectric body portions 316aa, 316ba, 316ca, 316da, 316ab, 316bb, 316cb, and 316db of the piezoelectric sheet 311, each of the piezoelectric body portions 317aa, 317ab, 317ca, and 317cb that drive in the α-axis direction, and each of the piezoelectric body portions 317ba, 317bb, 317da, and 317db that drive in the β-axis direction extends to the annular portion 314 from each of the piezoelectric body portions, and is further electrically connected to a flexible member 310 comprising a flexible printed circuit from the annular portion 314. Each of the position sensors 309a, 309b, 309c, and 309d is also connected to an electric circuit in the interchangeable lens 100 by the flexible member 310.

Moreover, even when the focus lens 101 is not driven for wobbling, focusing, or shake correction, it is possible to correct the inclinations of the optical axes of the focus lens and other lenses, the misalignments of the optical axes with the X-axis direction and the Y-axis direction, and the lens intervals with an extremely high degree of accuracy by applying different voltage signals to each of the piezoelectric body portions 316aa, 316ba, 316ca, 316da, 316ab, 316bb, 316cb, and 316db, each of the piezoelectric body portions 317aa, 317ab, 317ca, and 317cb, and each of the piezoelectric body portions 317ba, 317bb, 317da, and 317db.

If a correction voltage that provides correction displacement is added to a wobbling drive signal or a focus signal as an offset signal to perform control in the case of wobbling or focus driving, more precise wobbling, focusing, or shake correction can be performed with simple control.

It is also possible to adjust the lens position by adjusting the inclinations of the lenses constituting the photographic lens 113, the amount of a shift from the optical axis O1, and the lens intervals using the driver according to the present embodiment at the time of the assembly of the photographic lens 113, and adhesively bonding and fixing the movable frame 302 to the fixing frame 301 after the positional adjustment.

Figure 7:
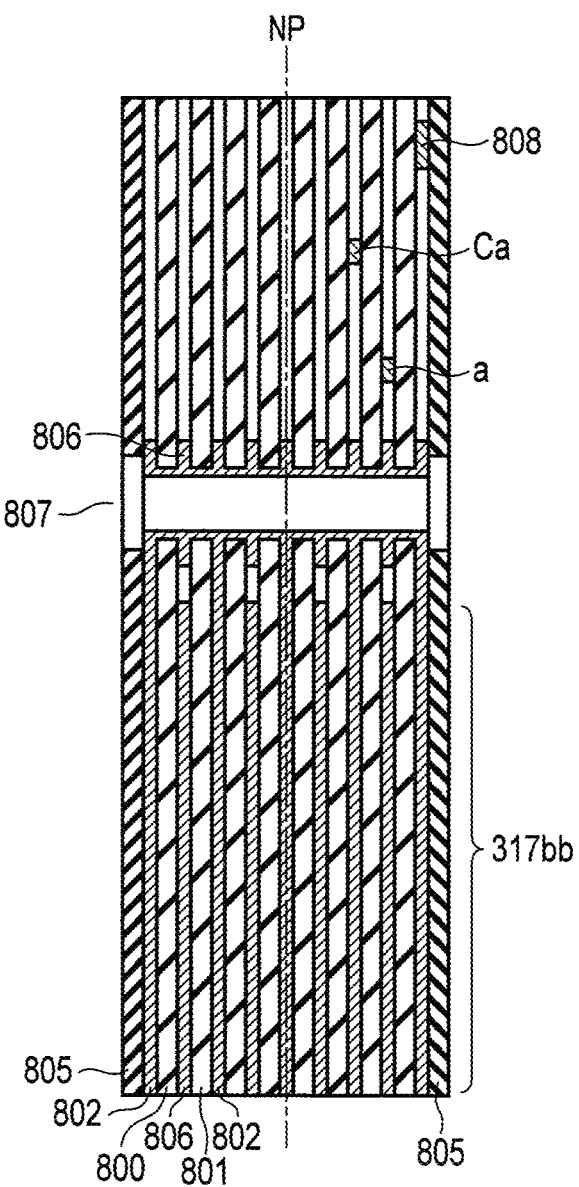
FIG. 7 is a sectional side view taken along the line C-C illustrating the detailed structure of the piezoelectric sheet shown in FIG. 5.
Figure 8:
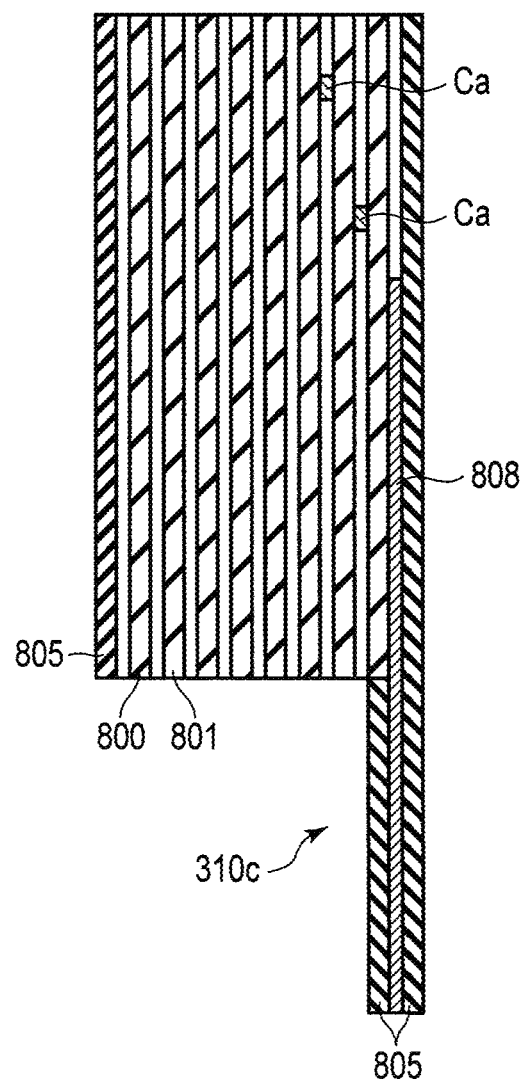
FIG. 8 is a sectional side view taken along the line D-D illustrating the detailed structure of the piezoelectric sheet shown in FIG. 5.

The structure of the piezoelectric sheet 311 is described with reference to FIG. 5 to FIG. 8. FIG. 5 shows a developed front diagram of the detailed structure of the piezoelectric sheet 311 shown in FIG. 4. FIG. 6 shows a sectional side view of the piezoelectric sheet 311 shown in FIG. 5 taken along the line B-B. FIG. 7 shows a sectional side view of the piezoelectric sheet 311 shown in FIG. 5 taken along the line C-C (to be precise, for one through-hole). FIG. 8 shows a sectional side view of the piezoelectric sheet 311 shown in FIG. 5 taken along the line D-D.

The piezoelectric sheet 311 comprises sheets of a piezoelectric L-polylactic acid 800 and sheets of a piezoelectric D-polylactic acid 801 that are alternately stacked. Conductive signal electrodes 802 and GND electrodes 806 are alternately formed between the layers (the layers of the L-polylactic acid 800 and the D-polylactic acid 801) of each of the piezoelectric body portions 316aa, 316ba, 316ca, 316da, 316ab, 316bb, 316cb, and 316db, each of the piezoelectric body portions 317aa, 317ab, 317ca, and 317cb, and each of the piezoelectric body portions 317ba, 317bb, 317da, and 317db (hereinafter generically referred to as a piezoelectric body portion PZ). A voltage signal is applied to the piezoelectric body portion of each layer (each of the layers of the L-polylactic acid 800 and the D-polylactic acid 801).

The piezoelectric sheet 311 comprises a first drive piezoelectric layer (first piezoelectric body portion) 803 and a second drive piezoelectric layer (second piezoelectric body portion) 804. The first drive piezoelectric layer 803 and the second drive piezoelectric layer 804 are reverse in the stacking direction of the L-polylactic acid 800 and the D-polylactic acid 801. Thus, if the first drive piezoelectric layer 803 expands by the application of voltage signals to the first drive piezoelectric layer 803 and the second drive piezoelectric layer 804, the second drive piezoelectric layer 804 contracts.

Insulating layers 805 are respectively formed on the front and rear sides of the piezoelectric sheet 311. The insulating layers 805 may be L-polylactic acid or D-polylactic acid sheets, or may be insulating resin sheets such as other polyimide sheets. The first drive piezoelectric layer 803 and the second drive piezoelectric layer 804 do not need to comprise the L-polylactic acid sheets or D-polylactic acid sheets. The first drive piezoelectric layer 803 and the second drive piezoelectric layer 804 may be made of any materials that are displaced by voltage application, and may be made of, for example, piezoelectric polyvinylidene fluoride or a polymer ion material such as a polyvinyl alcohol containing an ionic liquid.

The basic configuration of the piezoelectric sheet 311 includes the signal electrode 802, one polylactic sheet, the GND electrode 806, and one polylactic sheet in which a lead line of the GND electrode 806 is formed. In the piezoelectric sheet 311, the signal electrode 802, the polylactic sheet, the GND electrode 806, and the polylactic sheet in which the lead line is formed make pairs to make multiple layers so that the first drive piezoelectric layer 803 and the second drive piezoelectric layer 804 are formed. Even layers may not be always formed and odd layers may be formed as long as the layers are alternately stacked. The signal electrode 802 is formed by, for example, vapor deposition of aluminum on a part corresponding to the piezoelectric body portion PZ. One sheet has the GND electrode 806 and its lead line formed in piezoelectric parts by, for example, vapor deposition of aluminum.

An electrode is formed on one side of the insulating layer 805. In the insulating layer 805, an electrode for applying a voltage signal to the piezoelectric body portion PZ is formed, and a wiring line for drawing the circuit line is also formed.

Each of lead portions 310*a*, 310*b*, 310*c*, and 310*d* comprises a circuit line (wiring line) that intervenes between the insulating layers 805 as shown in FIG. 8. At the end of the circuit line of the insulating layer 805, a terminal that is not covered with this insulating layer 805 is formed. This terminal is electrically connected, by, for example, solder, a conductive adhesive agent, or an electric connector, to the flexible member 310 which is connected to other circuits such as a position detection sensor.

On the other hand, the signal electrode 802 and the GND electrode 806 are provided so that the polylactic sheet intervenes in between. Circuit lines (wiring lines) are drawn from different positions of the signal electrode 802 and the GND electrode 806. These circuit lines are electrically connected on the inner circumferential side of a through-hole 807 which is an opening formed in the piezoelectric sheet 311, and also electrically connected to circuit lines of the lead portions.

Although the through-hole 807 is used to electrically connect the first drive piezoelectric layer 803 and the second drive piezoelectric layer 804 here, it should be understood that a circuit line drawn out on the side surface of the outer of the piezoelectric sheet 311 may be electrically connected by forming a conductive layer on the side surface. In this case, the conductive layer is exposed in the outer part of the piezoelectric sheet 311, and is therefore preferably covered with the insulating layer 805 to avoid any short circuits.

Although the outermost insulating layer 805 alone is drawn out of the piezoelectric sheet 311 in each of the lead portions 310*a*, 310*b*, 310*c*, and 310*d*, the first drive piezoelectric layer 803 and the second drive piezoelectric layer 804 may be partly drawn out to constitute the other insulating layer 805. In such a configuration, the front independent insulating layer 805 shown in FIG. 8 is no longer needed.

Now, the wiring of the piezoelectric body portion PZ of the piezoelectric sheet 311 is described with reference to FIG. 5.

Although four piezoelectric body portions PZ are provided in four places (one piezoelectric body portion on each of the front and rear sides of the movable frame 302, and two piezoelectric body portions in the outer circumferential parts), the wiring of the piezoelectric body portions are similar. The wiring of each of the piezoelectric body portions 316*aa* and 316*ab* and each of the piezoelectric body portions 317*aa* and 317*ab* are only described.

Wiring lines are drawn from each of the GND electrodes 806 of the piezoelectric body portions 316*aa*, 317*aa*, and 317*ab*. The wiring lines are connected to the through-hole 807, and then connected to a wiring line (GND line) 808 of the lead portion 310*a*, and then connected to the ground of the piezoelectric sheet control circuit 112.

Wiring lines (signal lines) drawn from the signal electrode of the piezoelectric body portion 316*aa* are connected to a first through-hole 807*a*, connected to a second through-hole 807*b* through a wiring line (signal line Ba) formed in a layer of a polylactic acid sheet different from the insulating layer 805 in which the GND line 808 is formed, connected to a wiring line (signal line Bb) of the lead portion 310*a* from the second through-hole 807*b*, and drawn from the lead portion 310*a*, and then connected to the output terminal of the piezoelectric sheet control circuit 112.

Wiring lines are drawn from the GND electrode 806 of the piezoelectric body portion 316*ab*. These circuit lines are connected to the corresponding through-holes 807, connected to the GND line 808 formed in the insulating layer 805 from the through-holes 807, connected to the lead portion 310*a* from the GND line 808, and drawn from the lead portion 310*a* and then connected to the ground of the piezoelectric sheet control circuit 112.

Wiring lines drawn from the signal electrode of the piezoelectric body portion 316*ab* are similarly connected to the other corresponding through-holes 807, connected to the leader portion 310*a* through a wiring line (signal line A) formed in the insulating layer 805, and drawn from the leader portion 310*a* and then connected to the output terminal of the piezoelectric sheet control circuit 112.

On the other hand, wiring lines drawn from the signal electrodes of each of the piezoelectric body portions 317*aa* and 317*ab* are connected to the corresponding first through-hole 807*a*, connected to the second through-hole 807*b* through a wiring line (signal line Ca) formed in a layer of a polylactic acid sheet different from the insulating layer 805 in which the signal line Ba is formed, connected to a wiring line (signal line Cb) of the lead portion 310*a* from the through-hole 807, and drawn from the lead portion 310*a* and then connected to the output terminal of the piezoelectric sheet control circuit 112. Here, the GND line 808 is connected to the first through-hole 807*a*, and then drawn from the lead portion 310*a* through the GND line 808 formed in the insulating layer 805 and then connected to the ground of the piezoelectric sheet control circuit 112.

Now, the driving of the piezoelectric body portion PZ of the piezoelectric sheet 311 in the optical axis O1 direction (Z-axis direction) is described.

When the voltage signal from the piezoelectric sheet control circuit 112 is applied to the piezoelectric body portion 316*aa* through the signal line Ba, one of the first drive piezoelectric layer 803 and the second drive piezoelectric layer 804 expands in the longitudinal direction (Y-axis direction), and the other contracts. Here, the piezoelectric body portion 316*aa* has the first drive piezoelectric layer 803 and the second drive piezoelectric layer 804 that are stacked and integrally formed. One end of the piezoelectric body portion 316*aa* is further connected to the bent portion 315*a* fixed to the fixing frame 301. Thus, a piezoelectric body portion 312*a* bends in the thickness direction (Z-axis direction).

When the voltage signal is applied to the piezoelectric body portion 316*ab* from the piezoelectric sheet control circuit 112 through the signal line A, one of the first drive piezoelectric layer 803 and the second drive piezoelectric layer 804 expands in the longitudinal direction (Y-axis direction), and the other contracts in the same manner as above. Thus, both ends of the Z-displacement portion 312*ab* in which the piezoelectric body portion 316*ab* is formed have a curving shape supported by the fixing frame 301, and only one end is connected and thus fixed to the annular portion 314. Therefore, the curvature of the curve changes, and the position of a protrusion of the curve in the Z-axis direction is displaced.

The protrusion of the curve in the Z-axis direction supports the rear end of the movable frame 302 in the Z-axis direction. The distal end of the Z-displacement portion 312*aa* in which the piezoelectric body portion 316*aa* is disposed supports the front end of the movable frame 302 in the Z-axis direction. Voltage signals are respectively applied to the piezoelectric body portions 316aa and 316ab so that the supports operate in the Z-axis direction. The magnitude of each of the voltage signals applied to each of the piezoelectric body portions 316aa and 316ab is adjusted on the basis of the displacement amount of the movable frame 302 in the Z-axis direction detected by each of the position sensors 309a, 309b, 309c, and 309d. Thus, the position of the movable frame 302 in the Z-axis direction is adjusted.

Furthermore, if the displacement amounts of the four piezoelectric body portions PZ which are displaced in the Z-axis direction are changed, the inclination of the movable frame 302 relative to the Z-axis can also be adjusted. Although the first drive piezoelectric layer 803 and the second drive piezoelectric layer 804 are used to bend and displace each of the piezoelectric body portions 316aa and 316ab, it is also possible to form the bendable piezoelectric sheet 311 by using the first drive piezoelectric layer 803 alone so that a rectangular plate-shaped elastic body made of a resin or a metal is fixedly connected to one side of the first drive piezoelectric layer 803.

In this case, if the first drive piezoelectric layer 803 expands in the Y-axis direction, the elastic body bends so that the side of the first drive piezoelectric layer 803 protrudes because the elastic body hardly expands. In contrast, if the first drive piezoelectric layer 803 contracts in the Y-axis direction, the elastic body bends so that the side of the first drive piezoelectric layer 803 is depressed because the elastic body hardly contracts. In the case of this form, the elastic body reinforces the piezoelectric sheet 311, but energy to deform the elastic body is needed, so that the generative force and displacement amount of each of the piezoelectric body portions 316aa and 316ab decrease. A neutral axis NP of the bending of the first drive piezoelectric layer 803 and the second drive piezoelectric layer 804 is shown in FIG. 6.

Now, the driving of the piezoelectric body portion PZ of the piezoelectric sheet 311 in the α-axis direction (the direction that intersects at right angles with the Z-axis direction) is described.

When the voltage signal from the piezoelectric sheet control circuit 112 is applied to each of the piezoelectric body portions 317aa and 317ab through the signal line Ca, one of the first drive piezoelectric layer 803 and the second drive piezoelectric layer 804 expands in the longitudinal direction (Y-axis direction), and the other contracts. Each of the piezoelectric body portions 317aa and 317ab has the first drive piezoelectric layer 803 and the second drive piezoelectric layer 804 that are stacked and integrally formed, and one end of each of the piezoelectric body portions 317aa and 317ab is further connected to the bent portion 315a fixed to the fixing frame 301. Thus, each of the piezoelectric body portions 317aa and 317ab bends in the thickness direction (α-axis direction).

On the other hand, each of the piezoelectric body portions 317ca and 317cb is similar in configuration to each of the piezoelectric body portions 317aa and 317ab. Therefore, in the same manner as above, when the voltage signal from the piezoelectric sheet control circuit 112 is applied to each of the piezoelectric body portions 317ca and 317cb, each of the piezoelectric body portions 317ca and 317cb is bent and displaced in the α-axis direction.

When a voltage signal such that the displacement amount of each of the piezoelectric body portions 317ca and 317cb may be the same as the displacement amount of each of the piezoelectric body portions 317aa and 317ab and such that the directions of the displacements may be the same is applied to each of the piezoelectric body portions 317ca and 317cb and each of the piezoelectric body portions 317aa and 317ab, each of the arm portions 313aa, 313ab, 313ca, and 313cb in which the piezoelectric body portion PZ is formed and the movable frame 302 supported at the distal end of each of the arm portions 313ba, 313bb, 313da, and 313db can be displaced in the α-axis direction. It should be understood that this displacement amount can be changed by the degree of the voltage value. The driving in the β-axis direction is similar to the driving in the α-axis direction and is therefore not described here.

In such a structure of the piezoelectric sheet 311, the degree of freedom in the design of the shape of the driver can be higher. That is, the driver can be thinly formed and have a bendable structure. The fixing method of the driver also has fewer restrictions attributed to the characteristics of materials.

It is thus possible to obtain a small-sized and lightweight driver which fully ensures the precision of driving and which can have a thinner shape and which makes use of flexible characteristics.

(First Modification)

Figure 9:
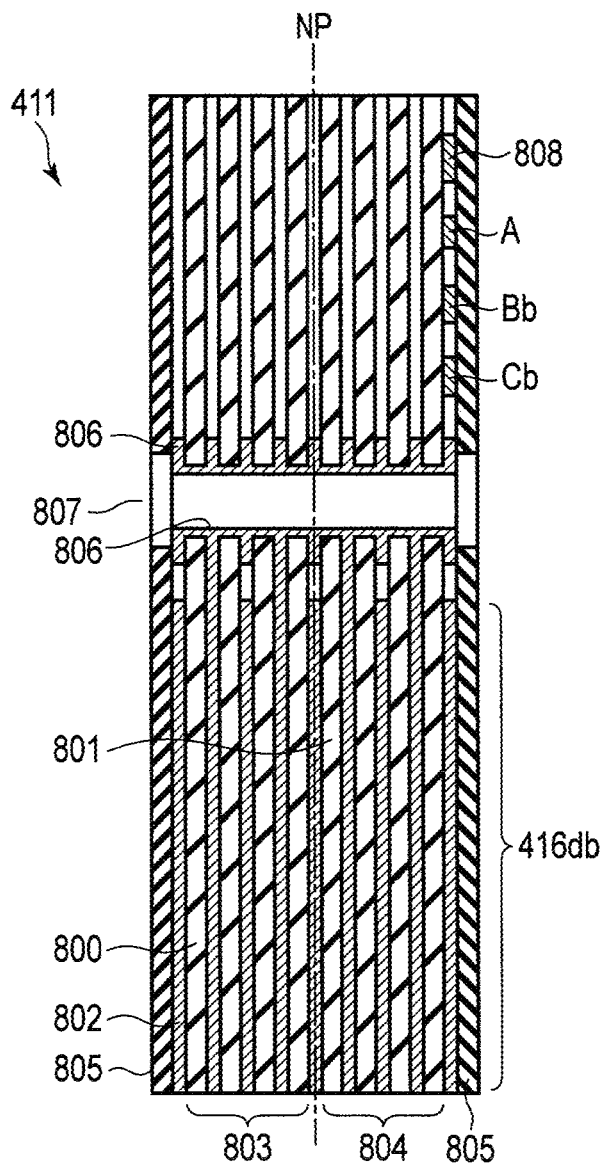
FIG. 9 is a sectional view showing a modification of the structure of the piezoelectric sheet.
Figure 10:
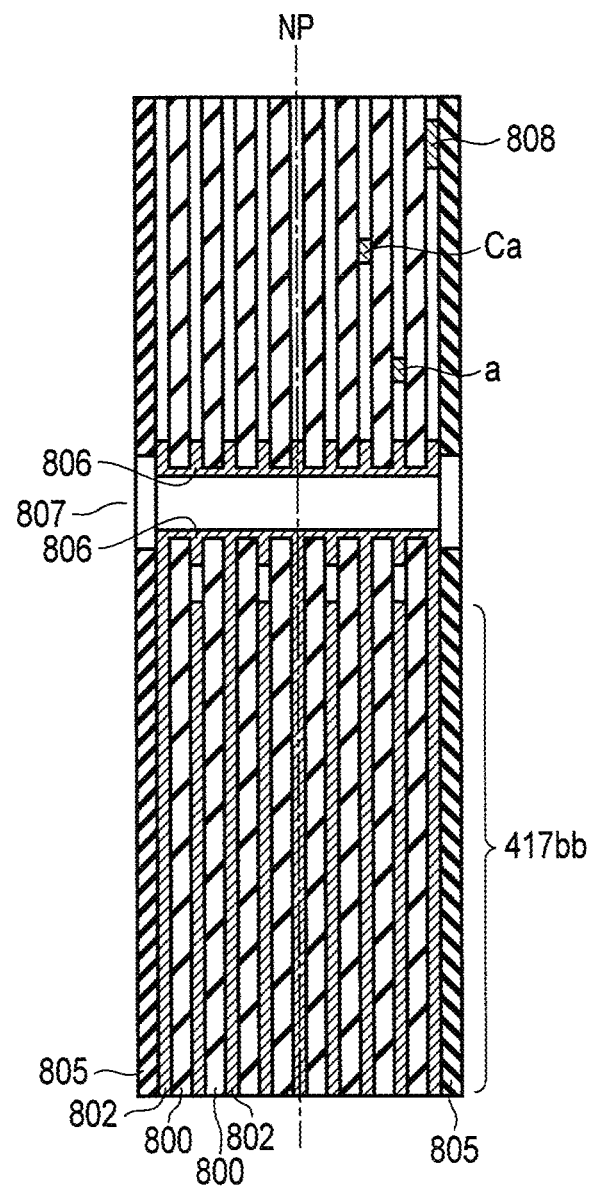
FIG. 10 is a different sectional view of the piezoelectric sheet shown in FIG. 9.

Now, a first modification of the present invention is described mainly in connection with the differences between the first modification and the first embodiment. FIG. 9 and FIG. 10 show a partly sectional view of a modification of the piezoelectric body portion of the piezoelectric sheet 311 different from the first embodiment shown in FIG. 5 to FIG. 8. FIG. 9 shows a sectional view corresponding to the sectional side taken along the line B-B shown in FIG. 5. FIG. 10 shows a sectional view corresponding to the sectional side view taken along the line C-C sheet shown in FIG. 5. Although the line C-C traverses two through-holes, to avoid complexity of the drawing in FIG. 5, only one through-hole is shown here, to simplify explanation.

The first drive piezoelectric layer 803 is formed by the sheets 800 of the L-polylactic acid. The second drive piezoelectric layer 804 is formed by the sheets 801 of the D-polylactic acid. The GND electrode 806 and the signal electrode 802 are configured so that each sheet intervenes in between. The GND electrode 806 and the signal electrode 802 are provided to apply voltage signals to the sheets 800 of the L-polylactic acid and the sheets 801 of the D-polylactic acid.

If a voltage signal is applied to the first drive piezoelectric layer 803 of the piezoelectric sheet 311 from the piezoelectric sheet control circuit 112, one of the first drive piezoelectric layer 803 and the second drive piezoelectric layer 804 expands, and the other contracts. Thus, the piezoelectric body portion PZ bends in the optical axis O1 direction as in the first embodiment.

Now, the relation between a drive signal, the operation of the focus lens 101, and the imaging operation at the time of focal position detection in the case in which the focus lens 101 according to the present embodiment is wobbled is described with reference to FIG. 11A, FIG. 11B, and FIG. 12.

Figure 11A:
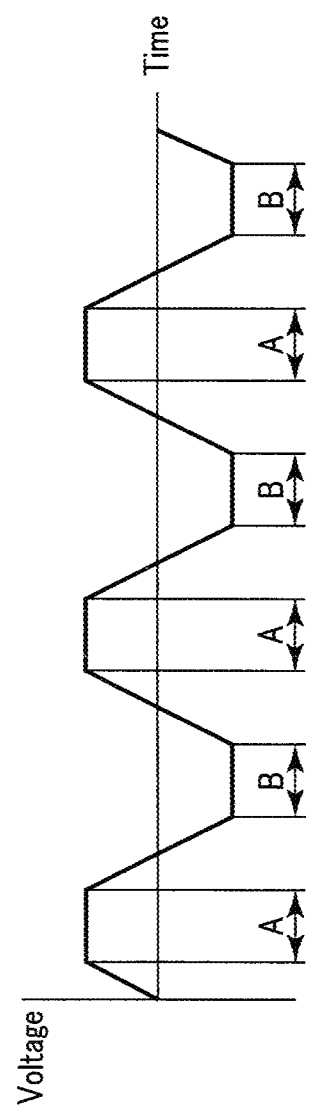
FIG. 11A is a time chart illustrating an operation by a voltage signal applied to the piezoelectric sheet during wobbling, and is a diagram showing a drive signal applied to a piezoelectric body portion PZ.

FIG. 11A shows a drive signal applied to the piezoelectric body portion PZ. Such a frequency as the frequency of the frame rate of imaging is selected. The voltage signal has trapezoidal waves, but may have sinusoidal waves or rectangular waves instead of the trapezoidal waves.

Figure 11B:
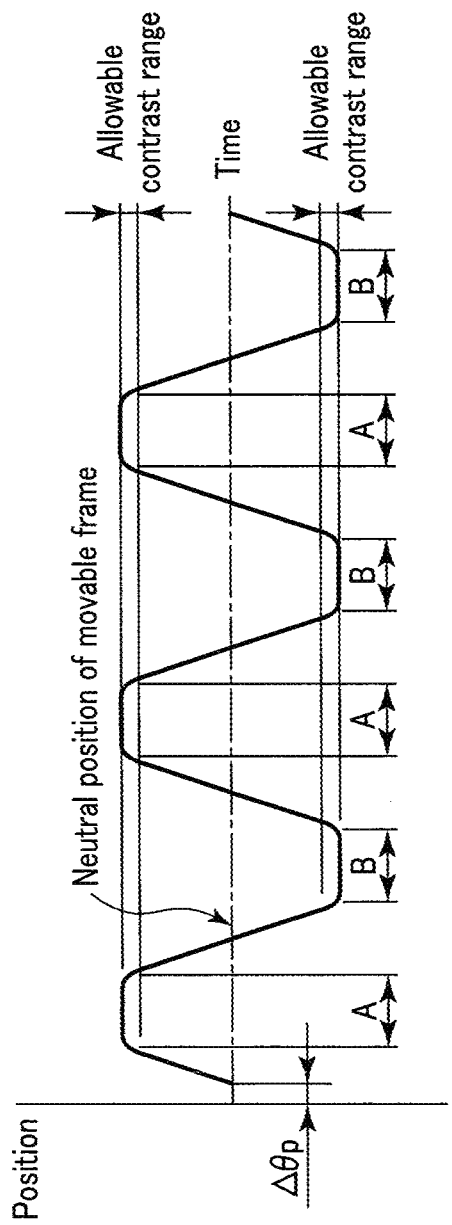
FIG. 11B is a time chart illustrating an operation by a voltage signal applied to the piezoelectric sheet during wobbling, and is a diagram showing the position of a focus lens at which the focus lens vibrates in the optical axis direction in response to the voltage signal.

FIG. 11B shows the position of the focus lens 101 at which the focus lens 101 vibrates in the optical axis direction in response to the voltage signal when the drive signal shown in FIG. 11A is applied to the piezoelectric sheet 311. In this instance, the focus lens 101 operates so that the phase shifts relative to a drive voltage (drive waveform) of the drive signal applied to the piezoelectric body portion PZ, and operates to correspond to a vibration waveform of a trapezoid having obtuse angles. That is, the focus lens 101 operates so that the phase shifts by a phase difference $\Delta\theta p$ relative to the drive voltage (drive waveform) and operates with a vibration waveform of a trapezoid having obtuse angles, due to the spring characteristics and damping characteristics of the bending of the piezoelectric sheet 311 and the mass of the focus lens 101.

Furthermore, if imaging is not performed at a predetermined position of the focus lens 101, full image contrast is not obtained, and an AF evaluation value cannot be properly determined. Therefore, to be in an allowable contrast range for determination for a long time, driving that is as close to trapezoidal wave vibration is preferable. The time of being in the allowable contrast range is longer if the rectangular waves are used instead of the trapezoidal waves. However, in the case of the rectangular waves, unnecessary vibration is generated in the rising and falling parts, and overshoot of operation occurs.

FIG. 12 shows the operation of the piezoelectric sheet 311 during AF. In AF, the focus lens 101 wobbles at the beginning. In imaging during the wobbling operation, front position imaging in which imaging is performed with the focus lens 101 located at a front position alternates with rear position imaging in which imaging is performed with the focus lens 101 located at a rear position. In this imaging, the contrasts of the images acquired at the front and rear positions of the focus lens 101 are compared, and the direction of the focal position is found out from the comparison result.

Imaging is then performed while the focus lens 101 is operated in the direction of the in-focus position. Multiple images are acquired by this imaging, so that contrasts are calculated from these images. The focus lens 101 is stopped at the position which is determined to have the maximum contrast among the above contrasts.

In the operation of determining the maximum contrast, the focus lens 101 is operated in the direction of the in-focus position to acquire contrasts until the focus lens 101 passes through the in-focus position, and the focus lens 101 is reversely driven toward the in-focus position after the focus lens 101 has passed through the in-focus position where the maximum contrast is acquired. Actually, this maximum contrast determination is made by performing the trapezoidal wave driving which is the operation of the in-focus position checking shown in FIG. 10 and which has amplitude equal to or more than that of the wobbling operation.

Figure 13:
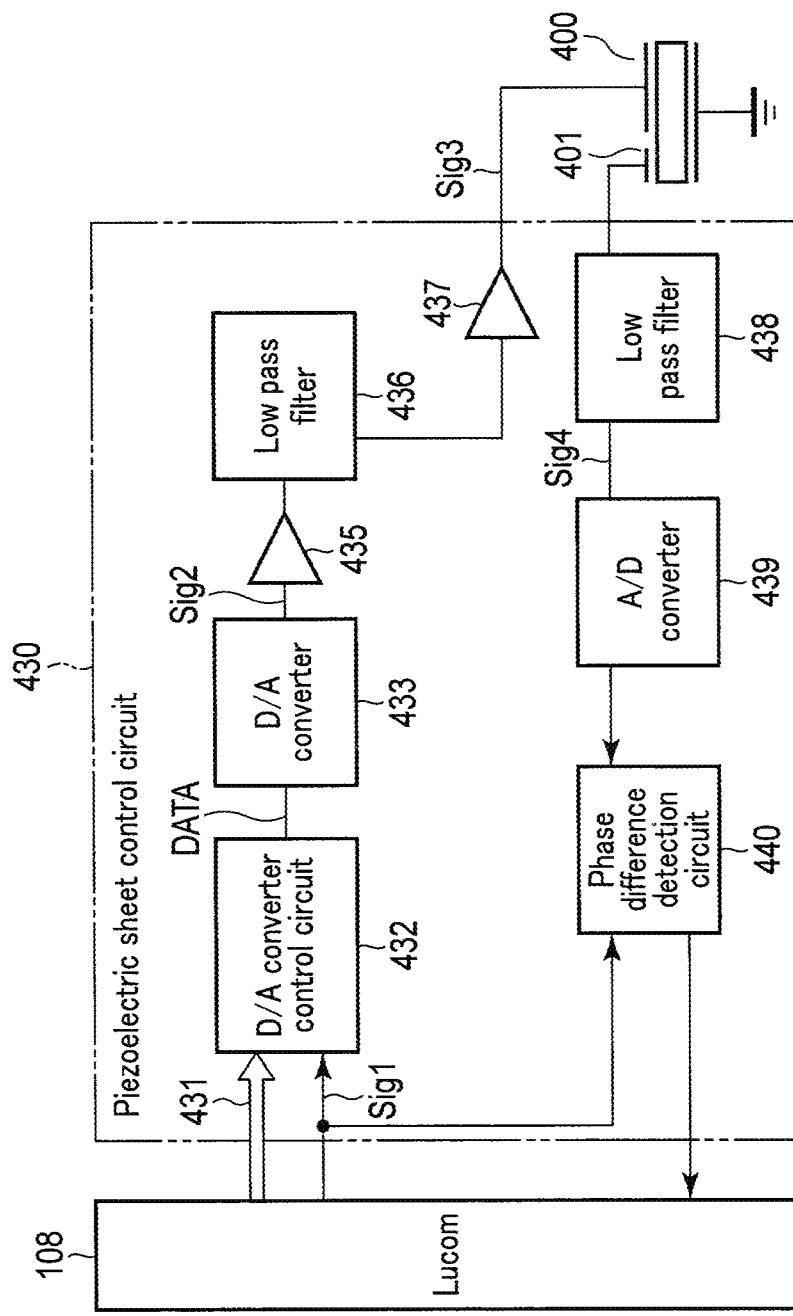
FIG. 13 is a diagram showing a control circuit which drives and controls the piezoelectric sheet.
Figure 14:
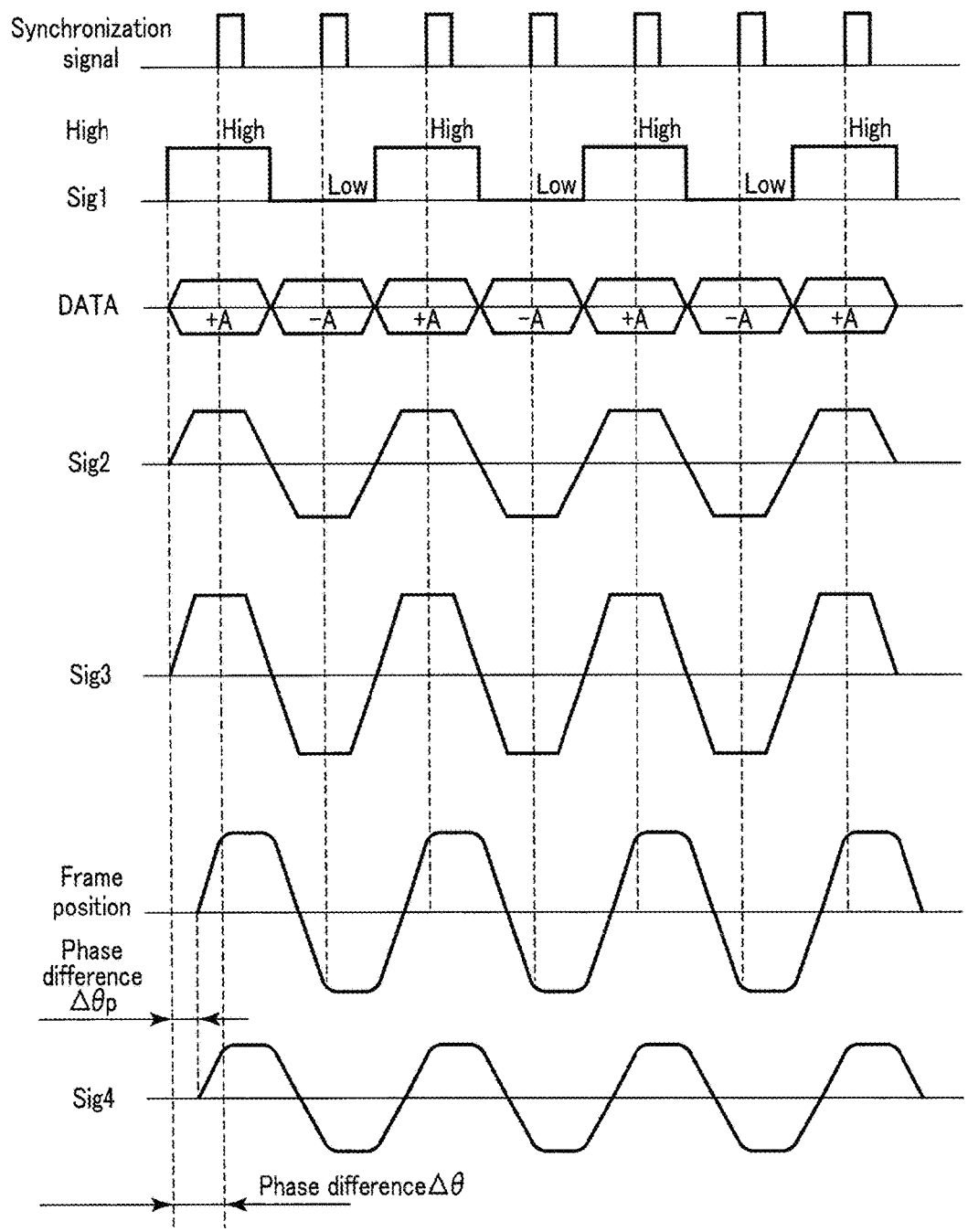
FIG. 14 is a time chart illustrating the operation of the focus lens by signals output from the control circuit in FIG. 13.

FIG. 13 shows a schematic diagram of a piezoelectric sheet control circuit 430 (112). FIG. 14 shows a time chart of signals from the main components of the circuit corresponding to FIG. 13.

A signal Sig1 in which a phase difference $\Delta\theta$ is corrected with reference to a synchronization signal of imaging is output from the Lucom 108. This signal Sig1 is input to a D/A converter control circuit 432 via a bus 431. When the signal Sig1 is high, the D/A converter control circuit outputs a trapezoidal waveform +A in the form of a "+" voltage signal as DATA. When the signal Sig1 is low, the D/A converter control circuit outputs a trapezoidal waveform −A in the form of a "−" voltage signal as DATA. The trapezoidal waveform +A and the trapezoidal waveform −A are sent to a D/A converter 433. Here, A is the amplitude value of the drive signal. The amplitude value A of this drive signal is indicated by the Lucom 108.

An output signal Sig2 of the D/A converter 433 is input to a low pass filter 436 after being amplified by an amplifier 435, and output as pseudo trapezoidal waves after a high-frequency component is removed by the low pass filter 436. A signal output from the low pass filter 436 is amplified by an amplifier 437, and applied to a piezoelectric body portion 400 as a drive signal Sig3.

In the meantime, a voltage signal corresponding to a vibration state from a detection piezoelectric layer (see FIG. 18 and FIG. 19) of the piezoelectric body portion 400 is input to a low pass filter 438, and becomes a signal Sig4 in which a high-frequency component has been removed by the low pass filter 438. This signal Sig4 is converted into digital data by an A/D converter 439, and then input to a phase difference detection circuit 440.

The phase difference detection circuit 440 detects a phase difference $\Delta\theta$ between the signal Sig4 and the signal Sig1. This phase difference $\Delta\theta$ is input to the Lucom 108 as digital data. The Lucom 108 corrects the phase of the signal Sig1 with respect to the synchronization signal on the basis of the digital data regarding the phase difference $\Delta\theta$.

Comparison data between the signal Sig2 and the output of the A/D converter 439 may be input to the Lucom 108, and the gain may be corrected in the Lucom 108.

A drive circuit and a drive signal of the piezoelectric body portion which drives in the $\alpha$-axis direction and the $\beta$-axis direction that intersect at right angles with the optical axis for the shake correction are similar to those in the case of focusing and are therefore not described. In the case of focusing, a signal from one drive circuit may be supplied to all the signal lines if the inclination of the movable frame 302 relative to the optical axis is not corrected. When the inclination relative to the optical axis is corrected, a circuit configuration that generates four independent drive signals is needed. In the driving in the $\alpha$-axis and $\beta$-axis directions, a circuit that generates one independent signal for each axis is also needed.

In such a configuration of the piezoelectric sheet control circuit 430, even when each of drive systems including the focus lens 101 and the piezoelectric body portion 400 has error variations, it is possible to perform driving which makes corrections by directly acquiring the phase difference and amplitude variation of the vibration of the focus lens 101 relative to the drive signal from the piezoelectric body portion 400, thus enabling rapid and precise positional control.

Although the D/A converter control circuit 432 is provided to control the D/A converter 433 in the piezoelectric sheet control circuit 430, the D/A converter 433 may be directly controlled from the Lucom 108. The amplifiers 435 and 437 are not essential, and may be provided as needed. Although the signal from the detection piezoelectric layer of the piezoelectric body portion 400 is used to detect the vibration state, a signal from the position sensor which detects the position of the focus lens 101 may be used to detect the phase difference and amplitude. Regarding the circuits shown here, one circuit may be provided for each of the piezoelectric body portions 312, or one circuit may be provided for the multiple piezoelectric body portions 312 when the operational variation is small between the piezoelectric body portions 312.

Now, the operation of the camera system (digital camera) 10 having the above configuration is described with reference to a flowchart shown in FIG. 15.

Figure 15:
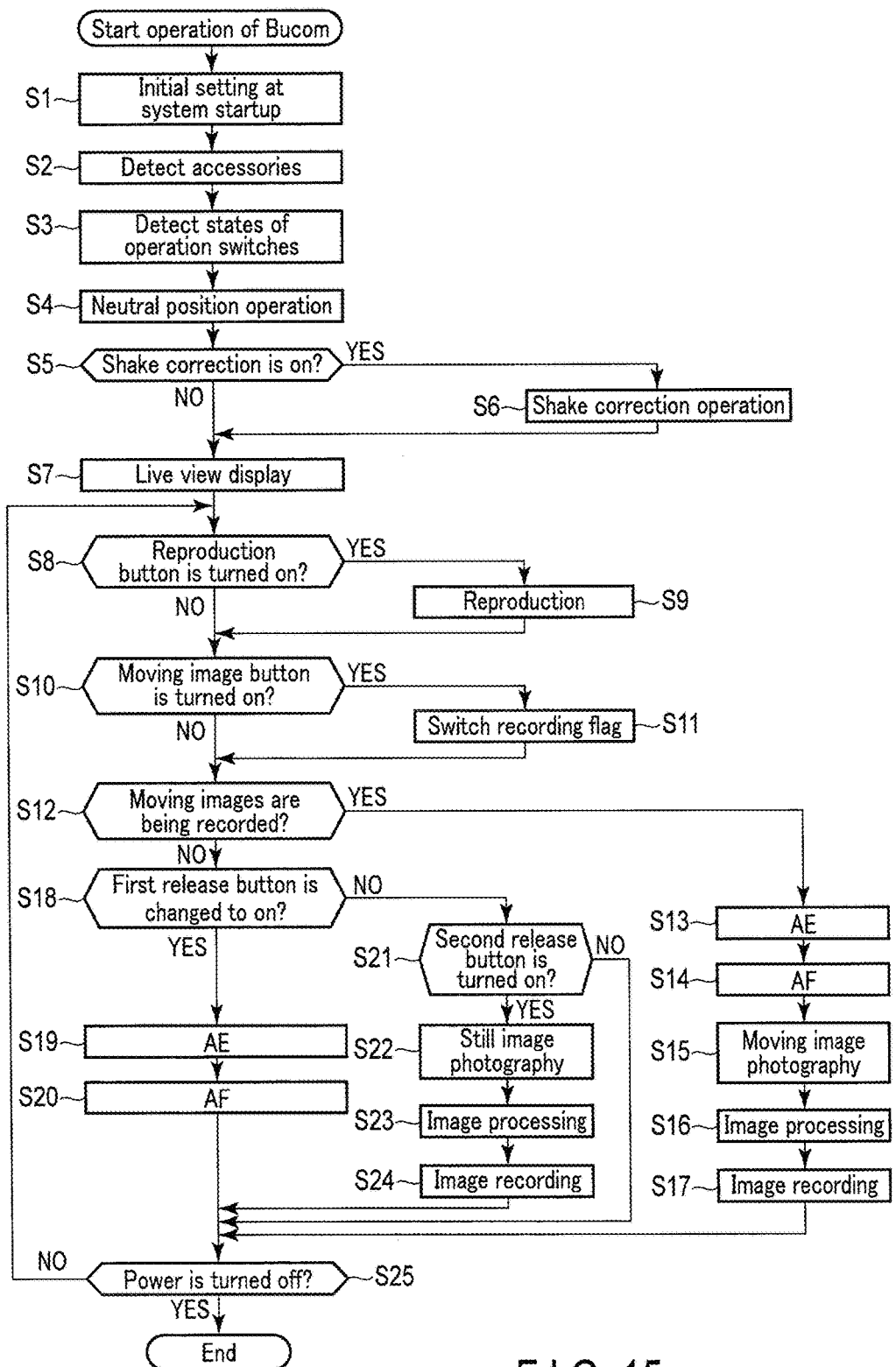
FIG. 15 is a flowchart illustrating the operation of the camera system.

When power is turned on in response to the operation of the power button, the Bucom 214 starts operating in accordance with the main flow shown in FIG. 15. After the start of operation, the Bucom 214 first performs initialization at system startup, and initializes a recording flag to off (step S1). This recording flag is a flag that indicates whether moving images are being recorded. The recording flag that is on indicates that moving images are being recorded. The recording flag that is off indicates that moving images are not being recorded.

After the initialization at system startup, the Bucom 214 detects accessories such as the interchangeable lens connected to the camera system 10 (step S2), detects operation of the switches such as the reproduction button (step S3), and performs a neutral position operation (step S4). In this neutral position operation, an imaging center adjustment and an optical axis direction initial position adjustment between the optical axis O1 and the image pickup device 202 are made, so that the Bucom 214 drives the piezoelectric sheet 111 to drive and control the focus lens 101 in a direction that intersects at right angles with the optical axis and in the optical axis direction. In the driving in the direction that intersects at right angles with the optical axis O1 and in the optical axis direction, the focus lens 101 may be sequentially driven in each of the directions, or may be simultaneously driven in a direction in which the two directions are composed.

The Bucom 214 then determines whether a shake correction switch in the operation unit 216 is on (step S5). If the shake correction switch is on, the Bucom 214 performs a shake correction operation (step S6).

When it is determined in step S5 that the shake correction switch is on, the Bucom 214 performs the shake correction operation in step S6, and then performs live view display (step S7). In this live view display, the Bucom 214 acquires an image signal by the image pickup device 202, processes the images for the live view display, and displays the live view on the LCD 210. If it is determined step S5 that the shake correction switch is not on, the Bucom 214 displays the live view in step S7.

The Bucom 214 then determines whether the reproduction button is pressed (step S8). If it is determined that the reproduction button is pressed, the Bucom 214 then performs reproduction (step S9). In this reproduction, the Bucom 214 reads image data from the recording medium 212, and displays the image data on the LCD 210.

After the reproduction is performed in step S9 or if the reproduction button is not pressed in step S8, the Bucom 214 determines whether the moving image button is pressed (step S10). This determination is made on the basis of the result of the detection of the operation state of the moving image button in the operation unit 216.

When it is determined that the moving image button is pressed, the Bucom 214 switches the recording flag (step S11). As described above, the start and end of the moving image photography alternate every time the moving image button is pressed. Thus, in step S11, the Bucom 214 switches on the recording flag that is off, or switches off the recording flag that is on.

After the recording flag is switched in step S11 or when it is determined in step S10 that the moving image button is not pressed, the Bucom 214 determines whether moving images are being recorded (step S12).

When it is determined in step S12 that moving images are not being recorded, the Bucom 214 determines whether a first release is pressed, i.e., whether a first release switch is changed from off to on (step S18). This determination is made on the basis of the result of the detection by the operation unit 216 regarding the state of the first release switch interlocked with a release button. In step S18, whether the first release switch is changed from off to on is determined, and if the on-state is maintained, the determination result is NO.

When it is determined in step S18 that the first release is pressed, the Bucom 214 takes an image at the time when the first release is pressed, and performs AE (step S19). In this image taking, an image signal is acquired by the image pickup device 202, the image is processed, and image data for use in the AE is acquired. The image data is not recorded in the recording medium 212.

The AE processing unit 205 measures the brightness of the subject, and determines exposure control values such as an aperture value and a shutter speed, and also determines a control value for displaying the live view on the LCD 210 with proper brightness.

The AF processing unit 207 then performs AF (step S20). The AF processing unit 207 evaluates the contrast of the image data acquired by the image pickup device 202 when the focus lens 101 is wobbled. The AF processing unit 207 controls the focus lens 101 by moving the focus lens 101 while detecting the direction of the focal position on the basis of the evaluation value of the contrast so that the image has the highest contrast.

When it is determined in step S18 that the release button is not pressed and the first release switch is not changed from off to on, the Bucom 214 determines whether a second release is pressed. In other words, the Bucom 214 determines whether the release button is fully pressed and a second release switch is changed from off to on (step S21). In step S21, the operation unit 216 detects the state of the second release switch interlocked with the release button, and the Bucom 214 makes a determination in accordance with this detection result.

When it is determined in step S21 that the second release is pressed, the Bucom 214 performs still image photography (step S22). Here, the Bucom 214 performs exposure in the image pickup device 202, and acquires an image signal corresponding to a subject image. After performing the still image photography, the Bucom 214 reads an image signal, and performs image processing of the image data regarding still images based on the image signal (step S23) and also performs image compression processing. After performing each of these processes, the Bucom 214 performs recording in the recording medium 212 (step S24).

When it is determined in step S12 that moving images are being recorded, the Bucom 214 performs AE as in step S19 (step S13). The Bucom 214 further performs AF (step S14), and then performs moving image photography (step S15). Here, the Bucom 214 acquires an image signal of the moving images by the image pickup device 202, and performs image processing of the image data by the image processing unit 206 (step S16), and after the compression of the moving images in the image compression/decompression unit 208, records the image data regarding the moving images in the recording medium 212 (step S17).

The Bucom 214 then determines whether the power switch of the operation unit 216 is turned off (step S25) when the AF operation is finished in step S20 or when it is determined in step S21 that the release button is not fully pressed or when the recording of the image data regarding the moving images in the recording medium 212 is finished in step S17 or when the recording of the image data regarding the still image in the recording medium 212 is finished in step S24. When it is determined that the power is not off, the Bucom 214 returns to step S8.

On the other hand, when it is determined that the power is off, the Bucom 214 finishes the main flow after performing the operation to end the main flow.

Now, the operation of AF with wobbling is described with reference to a flowchart shown in FIG. 16.

When the operation is started, the Bucom 214 determines whether the operation unit 216 has set the AF mode setting state of the camera system 10 to a mode for operating wobbling (step S101). When it is determined that the mode is not the mode for operating wobbling, the Bucom 214 determines the contrast of an image, and performs operation to control the focus lens 101 at the position where the contrast is maximized.

In contrast, when it is determined that the mode is the mode for operating wobbling, the Bucom 214 reads, from the flash memory 109, a voltage value A (see DATA shown in FIG. 14) corresponding to the frequency of wobbling and the amplitude of wobbling and a phase difference θ, and then sets them in the Lucom 108 (step S102).

The Bucom 214 drives each of the piezoelectric body portions 316aa, 316ab, 316ba, 316bb, 316ca, 316cb, 316da, and 316db by the piezoelectric sheet control circuit 112 in accordance with the setting of wobbling in step S102, and wobbles the focus lens 101 in the optical axis direction (step S103). This wobbling operation is synchronized with the synchronization signal of photography and the phase difference θ. Thus, the Bucom 214 performs photography alternately in a photography state in which the focus lens 101 is located close to the subject (front position) and in a photography state in which the focus lens 101 is located far from the subject (rear position) (step S104).

The Bucom 214 detects contrasts from the image taken at the front position and the image taken at the rear position (step S105). The Bucom 214 then compares the contrasts at the front position and the rear position, and sequentially detects the direction of the focal position (step S106).

The Bucom 214 determines from the taken images whether the detected contrasts are within the in-focus allowance (step S107). When it is determined that the contrasts are not within the allowance, the Bucom 214 drives the focus lens 101 in the direction of the detected focal position in a predetermined amount (step S108), and returns to step S103.

In contrast, when it is determined that the contrasts are within the allowance, the Bucom 214 keeps the wobbling of the focus lens 101 and the driving of the focus lens 101 stopped (step S109), and returns to the main flow.

Whether the contrasts are within the allowance is determined in step S107 by comparing the contrast of the image taken at the front position with the contrast of the image taken at the rear position. If the contrast difference is 0, the focus lens 101 is in focus at the intermediate position between the front position and the rear position. Therefore, if the wobbling is stopped in this state, the focus lens 101 stops at the position where it is in focus.

Now, the shake correction operation is described with reference to a flowchart shown in FIG. 17.

First, the X-axis gyro 114 and the Y-axis gyro 115 provided in the interchangeable lens 100 respectively detect the shake amounts of the camera system 10 as an angular velocity amount around the X-axis and an angular velocity amount around the Y-axis (step S201).

Each of the angular velocity amounts detected by the X-axis gyro 114 and the Y-axis gyro 115 is then input to the piezoelectric sheet control circuit 112 as an analog electric signal, and converted into a digital signal and then input to the Lucom 108.

The Lucom 108 calculates position correction amounts (shift amounts) for correcting the shake amount of the camera system 10, that is, position correction amounts of the focus lens 101 in the α-axis direction and β-axis direction from the digital signal of the angular velocity amounts (step S202).

The shift amount of the focus lens 101 is input to the piezoelectric sheet control circuit 112. The piezoelectric sheet control circuit 112 calculates a voltage signal to be applied to the piezoelectric body portion PZ of the piezoelectric sheet 311 corresponding to the shift amount of the focus lens 101, and applies this voltage signal to the piezoelectric sheet 111. As a result, a shake correction shift driving of the focus lens 101 is performed (step S203).

The Lucom 108 then repeats the operation from step S201 to step S203 until the shake correction is no longer set or until the power switch turns off (step S204).

(Second Modification)

Figure 18:
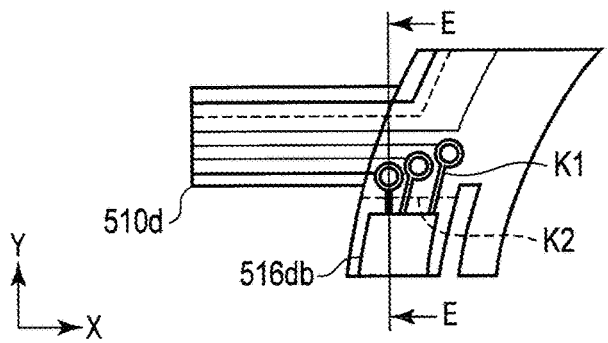
FIG. 18 is a partial front view illustrating the configuration of a piezoelectric sheet which is a second modification.
Figure 19:
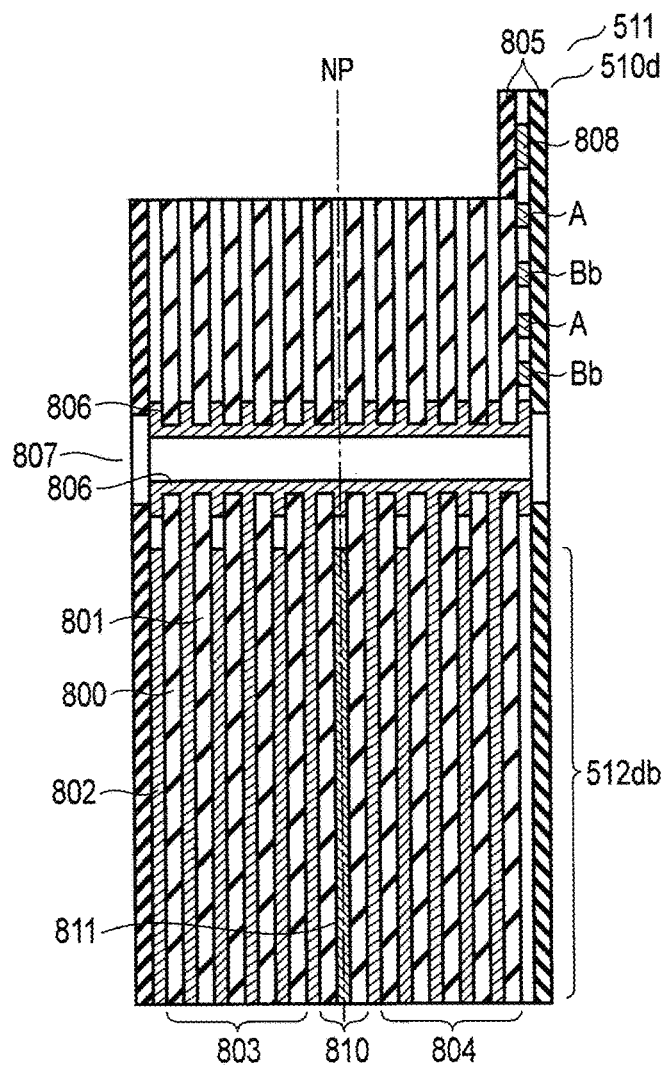
FIG. 19 is a sectional side view taken along the line E-E showing the piezoelectric sheet shown in FIG. 18.

Now, a second modification of the present invention is described with reference to FIG. 18 and FIG. 19. The second modification is only different from the first embodiment in the structure of the piezoelectric sheet 111, so that the differences are described. FIG. 18 shows a partial development diagram corresponding to the part in the vicinity of the piezoelectric body portion 316db of the piezoelectric sheet 311 in FIG. 5 according to the first embodiment. FIG. 19 is a sectional side view taken along the line E-E in FIG. 18.

The piezoelectric sheet 311 according to the first embodiment does not include any detection piezoelectric layer provided to correspond to a detection electrode in the piezoelectric sheet control circuit 430 shown in FIG. 13. In the present second modification, a detection piezoelectric layer 810 is provided in the vicinity of a neutral surface of a bending portion of the piezoelectric body portion PZ. Thus, in the present second modification, if the piezoelectric body portion PZ bends, a voltage signal is generated in response to the bending, and a bending displacement amount of the piezoelectric body portion PZ can be detected by detecting the voltage value. In FIG. 18, K1 indicates the wiring line of a detection electrode layer 811, and a broken line of K2 indicates the fold line of the piezoelectric sheet.

Second Embodiment

Now, a second embodiment of the present invention is described with reference to FIG. 20 to FIG. 22. The same parts as those in the first embodiment described above are provided with the same signs and are not described in detail.

Figure 20:
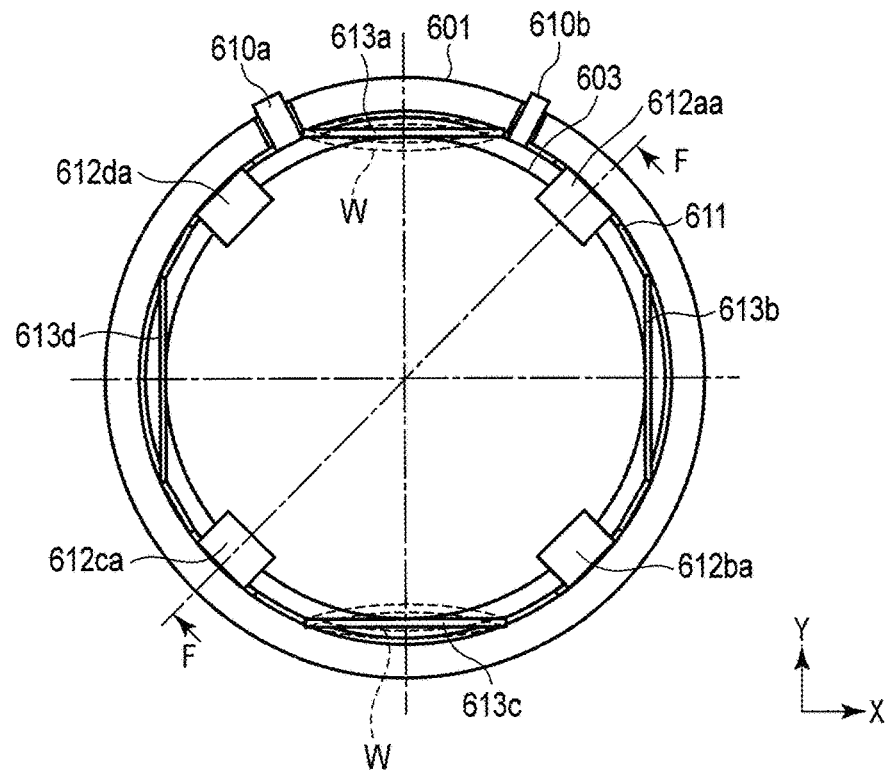
FIG. 20 is a front view illustrating the configuration of a focus/shake correction mechanism which is a second embodiment.

FIG. 20 shows a front view of a driver corresponding to FIG. 2 in the first embodiment described above. FIG. 21 shows a development diagram of a piezoelectric sheet used in the present embodiment, and corresponds to FIG. 5 in the first embodiment described above. FIG. 22 shows a sectional side view taken along the line F-F in FIG. 20.

A first difference is described.

While the movable frame 302 which holds the lens 303 is driven by the piezoelectric sheet 311 in the first embodiment described above, a lens 603 is directly driven by a piezoelectric sheet 611 in the present second embodiment.

Such a configuration permits the driver to be reduced in size by the thickness and the flexibility of the piezoelectric sheet 611. The lens 603 and the piezoelectric sheet 611 directly slide on each other, but the piezoelectric sheet 611 is flexible because of the resin, and therefore does not damage the lens 603. If thin sheet materials such as PTFE having a low coefficient of friction are attached to the slide surfaces of the piezoelectric sheet 611 and the lens 603, loss in the driving of the piezoelectric sheet 611 can be reduced. It should be understood that the lens 303 may be incorporated in the movable frame 302 as in the first embodiment described above.

A second difference is described.

The second difference is that the form of the piezoelectric sheet 611 is different. As shown in the development diagram of FIG. 21, the substantially belt-shaped piezoelectric sheet 611 is folded into a polygonal shape and wound around the outer circumferential part of the lens 603, and put through a hole 601b of a fixing frame 601 to adhesively bond and fix each of fixing portions 618aa, 618ab, 618ac, 618ba, 618bb, 618ca, 618cb, 618da, and 618db and each of joint portions 619a, 619b, 619c, and 619d by an adhesive agent 900. Each of the fixing portions 618aa, 618ab, 618ac, 618ba, 618bb, 618ca, 618cb, 618da, and 618db is formed at both ends of each of arm portions 613a, 613b, 613c, and 613d that are in contact with the fixing frame 601.

The position of each of the fixing portions 618aa, 618ab, 618ac, 618ba, 618bb, 618ca, 618cb, 618da, and 618db in the optical axis O1 direction is determined by putting a protrusion 901 protruding at the end of each of the fixing portions 618aa, 618ab, 618ac, 618ba, 618bb, 618ca, 618cb, 618da, and 618db onto a flange 601a of the fixing frame 601.

Therefore, the lens 603 is positioned and supported by each of the arm portions 613a, 613b, 613c, and 613d in the direction that intersects at right angles with the optical axis O1.

Four pairs of Z-displacement portions 612aa, 612ab, 612ba, 612bb, 612ca, 612cb, 612da, and 612db extend at the top and bottom of the belt. Each of the Z-displacement portions 612aa, 612ab, 612ba, 612bb, 612ca, 612cb, 612da, and 612db catches the lens 603 by the part bent toward the optical axis O1, and is positioned and supported in the optical axis O1 direction.

The piezoelectric body portion PZ which is bent and displaced in the direction that intersects at right angles with the optical axis O1 is provided in each of the arm portions 613a, 613b, 613c, and 613d.

The piezoelectric body portion PZ which is bent and displaced in the optical axis O1 direction is provided in each of the Z-displacement portions 612aa, 612ab, 612ba, 612bb, 612ca, 612cb, 612da, and 612db. A wiring line is formed in each of the piezoelectric body portions PZ as in the first embodiment described above. Each wiring line is drawn from each of lead portions 610a and 610b and connected to the piezoelectric sheet control circuit 112. Such a form permits more effective cutout from the material of the piezoelectric sheet and therefore permits size reduction of the driver.

Now, the operation of the driver having the above configuration is described.

In the driving of the lens 603 in the optical axis O1 direction (Z-axis direction), a voltage signal is applied to each of piezoelectric body portions 616aa, 616ba, 616ca, 616da, 616ab, 616bb, 616cb, and 616db so that each of the piezoelectric body portions 616aa, 616ba, 616ca, 616da, 616ab, 616bb, 616cb, and 616db is bent and displaced in the same direction as the optical axis O1 direction. Thus, the lens 603 supported by each of the Z-displacement portions 612aa, 612ab, 612ba, 612bb, 612ca, 612cb, 612da, and 612db is displaced in the optical axis O1 direction.

The Z-displacement portions 612aa, 612ab, 612ba, 612bb, 612ca, 612cb, 612da, and 612db which support the front side and rear side of the lens 603 have the same shape in contrast with the first embodiment described above, and two pairs of them arranged at opposite positions are provided at angular positions that divide the circumference of the optical axis into four equal parts. Thus, four pairs of Z-displacement portions 612aa, 612ab, 612ba, 612bb, 612ca, 612cb, 612da, and 612db are provided. Therefore, a force applied to the lens 603 can be uniform. The wiring becomes simpler. The number of wiring lines to be drawn from the respective lead portions 610a and 610b can be reduced. The positional control becomes simpler.

Figure 21:
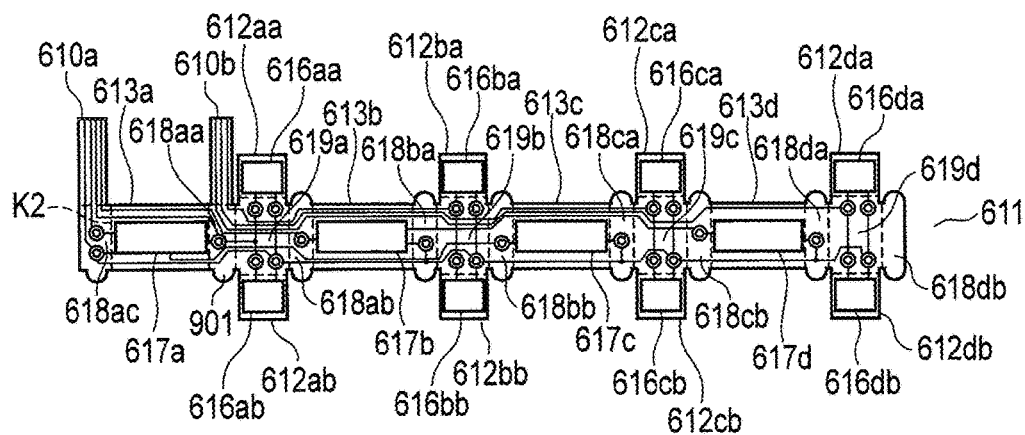
FIG. 21 is a development diagram illustrating the structure of a piezoelectric sheet shown in FIG. 20.

As shown in FIG. 21, the signal lines of the pairs of piezoelectric body portions 616aa and 616ab, 616ba and 616bb, 616ca and 616cb, and 616da and 616db are connected to one another. The GND electrode 806 and the signal electrode are provided to apply voltage signals to the polylactic acid layers. The GND electrode 806 and the signal electrode are connected so that the positions of the GND electrode 806 and the signal electrode are opposite to each other. Thus, each of the pairs of piezoelectric body portions 616aa and 616ab, 616ba and 616bb, 616ca and 616cb, and 616da and 616db is bent and displaced in the same optical axis O1 direction.

In contrast, the driving of the lens 603 in the direction that intersects at right angles with the optical axis O1 is described.

Each of pairs of piezoelectric body portions 617a and 617c, and 617b and 617d is bent and displaced in the same Y-axis and X-axis directions so that the lens 603 which is in contact with and supported on each of the arm portions 613a and 613c, and 613b and 613d is displaced in the X-axis and Y-axis directions. In FIG. 20 and FIG. 21, W indicates the displacement state of each of the arm portions 613a, 613b, 613c, and 613d. Signal lines of the pairs of piezoelectric body portions 617a and 617c, and 617b and 617d are connected to each other. The GND electrode 806 and the signal electrode are connected so that their positions are opposite to each other. Thus, each of the pairs of piezoelectric body portions 617a and 617c, and 617b and 617d is bent and displaced in the same direction. The GND electrode 806 is provided to apply voltage signals to the polylactic acid layers.

In both the first embodiment and second embodiment described above, multiple piezoelectric body portions which are bent and displaced in the optical axis direction and multiple piezoelectric body portions which are bent and displaced in the direction that intersects at right angles with the optical axis are formed in one piezoelectric sheet. It should be understood that these first and second embodiments are not limited to the above and that a driver may be configured by use of multiple piezoelectric sheets having at least one piezoelectric body portion that intersects at right angles with another.

The present invention is not limited to the embodiments described above, and modifications can be suitably made without departing from the spirit or concept of the invention that can be understood from the claims and the whole specification. Lenses, cameras, and camera systems that cover such modifications also fall within the technical scope of the present invention.

INDUSTRIAL APPLICABILITY

The present invention is not only applicable to the form of the lens of the digital camera described in the above embodiments but also applicable to an electronic device having a photographing function such as a recording device, a mobile telephone, a PDA, a personal computer, a game machine, a digital media player, a television, a GPS, or a timepiece.

What is claimed is:

1. A driver comprising:
a piezoelectric sheet including at least one first piezoelectric body portion which bends in a first direction, at least one second piezoelectric body portion which bends in a second direction that intersects at right angles with the first direction, and at least one connection portion which connects the first piezoelectric body portion and the second piezoelectric body portion;
a fixing frame to which the at least one connection portion is fixed;
a moving frame which is supported on the first piezoelectric body portion and the second piezoelectric body portion; and
a control circuit which applies voltage signals to the first piezoelectric body portion and the second piezoelectric body portion to bend the first piezoelectric body portion and the second piezoelectric body portion and which moves the moving frame in one of the first direction and the second direction or in a composite direction of the first direction and the second direction.

2. A driver comprising:
a stack resin sheet formed by fixedly connecting a first resin sheet which is displaced in at least a first direction that intersects at right angles with a thickness direction and second resin sheet which is displaced in a second direction opposite to the first direction, the stack resin sheet comprising a first displacement portion which is bent in at least a third direction different from the first and second directions, and a second displacement portion which is bent and displaced in a fourth direction that intersects at right angles with the third direction;
piezoelectric body portions which respectively apply voltage signals to the first and second displacement portions;
a connection portion which connects each of first ends of the piezoelectric body portions;
a fixing frame to which the connection portion is fixed;
a moving frame which is supported on second ends of the piezoelectric body portions different from the first ends; and
a control circuit which applies voltage signals to the piezoelectric body portions to bend each of the piezoelectric body portions and which displaces the moving frame relative to the fixing frame.

3. The driver according to claim 2, further comprising
an insulating resin sheet fixedly connected to an outer layer of the stack resin sheet, and
a circuit line which is formed in the insulating resin sheet and which applies voltage signals to the piezoelectric body portions.

4. The driver according to claim 2, wherein the moving frame holds an image pickup device or an optical element.

5. The driver according to claim 4, wherein when an optical axis of the image pickup device or the optical element and axes that intersect at right angles with each other in a plane that intersects at right angles with the optical axis are set,
the first piezoelectric body portion and the second piezoelectric body portion respectively drive the moving frame by bending and drive the image pickup device or the optical element held by the moving frame in the directions of the optical axis and one of the axes.

6. The driver according to claim 5, wherein the first piezoelectric body portion and the second piezoelectric body portion perform focusing and wobbling by driving the image pickup device or the optical element in a direction corresponding to the optical axis, and perform a shake correction operation by driving the image pickup device or the optical element in a direction corresponding to one of the axes that intersect at right angles with each other.

7. The driver according to claim 5, wherein the piezoelectric sheet includes a bending portion configured to bend the piezoelectric sheet, a pair of arm portions provided at both ends of the bending portion, and first and second displacement portions which displace the piezoelectric sheet,
the pair of arm portions rotate in directions to face each other to position and hold the image pickup device or the optical element in a direction that intersects at right angles with the optical axis, and
the first and second displacement portions position and hold the image pickup device or the optical element in the optical axis direction by the displacement of one or both of the first and second displacement portions.

8. An image instrument comprising:
an image pickup device or an optical element;
a stack resin sheet formed by fixedly connecting a first resin sheet which is displaced in at least a first direction that intersects at right angles with a thickness direction and a second resin sheet which is displaced in a second direction opposite to the first direction, the stack resin sheet comprising a first displacement portion which is bent in at least a third direction different from the first and second directions, and a second displacement portion which is bent and displaced in a fourth direction that intersects at right angles with the third direction;
piezoelectric body portions which respectively apply voltage signals to the first and second displacement portions;
a connection portion which connects each of first ends of the piezoelectric body portions;
a fixing frame to which the connection portion is fixed;
a moving frame which is supported on second ends of the piezoelectric body portions different the first ends and which holds the image pickup device or the optical element; and
a control circuit which applies voltage signals to the piezoelectric body portions to bend each of the piezoelectric body portions and which displaces the moving frame relative to the fixing frame.

9. The image instrument according to claim 8, further comprising
an insulating resin sheet fixedly connected to an outer layer of the stack resin sheet, and
a circuit line which is formed in the insulating resin sheet and which applies voltage signals to the piezoelectric body portions.

10. The image instrument according to claim 8, wherein when an optical axis of the image pickup device or the optical element and axes that intersect at right angles with each other in a plane that intersects at right angles with the optical axis are set,
the first piezoelectric body portion and the second piezoelectric body portion respectively drive the moving frame by bending and drive the image pickup device or the optical element held by the moving frame in the directions of the optical axis and one of the axes.

11. The image instrument according to claim 10, wherein the first piezoelectric body portion and the second piezoelectric body portion perform focusing and wobbling by driving the image pickup device or the optical element in a direction corresponding to the optical axis, and perform a shake correction operation by driving the image pickup device or the optical element in a direction corresponding to one of the axes that intersect at right angles with each other.

12. The image instrument according to claim 10, wherein the piezoelectric sheet includes a bending portion configured to bend the piezoelectric sheet, a pair of arm portions provided at both ends of the bending portion, and each of first and second displacement portions which displace the piezoelectric sheet,
   the pair of arm portions rotate in directions to face each other to position and hold the image pickup device or the optical element in a direction that intersects at right angles with the optical axis, and
   the first and second displacement portions position and hold the image pickup device or the optical element in the optical axis direction by the displacement of one or both of the first and second displacement portions.

\* \* \* \* \*